US007002868B2

(12) United States Patent
Takahashi

(10) Patent No.: US 7,002,868 B2
(45) **Date of Patent: *Feb. 21, 2006**

(54) HIGH-SPEED, TWO-PORT DYNAMIC RANDOM ACCESS MEMORY (DRAM) WITH A LATE-WRITE CONFIGURATION

(75) Inventor: Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 98 days.

This patent is subject to a terminal disclaimer.

(21) Appl. No.: 10/691,413

(22) Filed: Oct. 22, 2003

(65) Prior Publication Data

US 2004/0081006 A1 Apr. 29, 2004

(30) Foreign Application Priority Data

Oct. 23, 2002 (JP) ............................ 2002-308624

(51) Int. Cl.

*G11C 11/406* (2006.01)
*G11C 8/16* (2006.01)
*G11C 8/06* (2006.01)
*G11C 7/10* (2006.01)

(52) U.S. Cl. ................. 365/222; 365/189.04; 365/149; 365/230.05; 365/189.05; 365/230.08

(58) Field of Classification Search ................ 365/222, 365/149, 230.05, 230.08, 189.05, 230.02, 365/189.04

See application file for complete search history.

(56) References Cited

U.S. PATENT DOCUMENTS 5,856,940 A * 1/1999 Rao ........................... 365/149
5,963,497 A 10/1999 Holland
6,233,193 B1 * 5/2001 Holland et al. ............. 365/222
6,327,210 B1 * 12/2001 Kuroda et al. .............. 365/222
2004/0079968 A1 * 4/2004 Takahashi ................... 257/200

FOREIGN PATENT DOCUMENTS

| | | |
|---|---|---|
| JP | A-3-263685 | 11/1991 |
| JP | 2653689 | 5/1997 |
| JP | 9-190689 | 7/1997 |
| JP | 2001-143466 | 5/2001 |
| JP | P2001-283587 A | 10/2001 |

OTHER PUBLICATIONS

Sakurai et al., "Transparent-refresh DRAM (TReD) using dual-port DRAM cell," Proceedings of the IEEE 1988 Custom Integrated Circuits Conference, May 16-19, 1988, pp. 4.3/1-4.3/4.*

Enhanced Memory Systems, Inc., Web Page Products News; Preliminary Datasheet, 72Mbit Pipelined BSRAM w/ NoBL Architecture 2M×36 (30 pages).

* cited by examiner

*Primary Examiner*—Richard Elms
*Assistant Examiner*—J. H. Hur
(74) *Attorney, Agent, or Firm*—Muirhead and Saturnelli, LLC

(57) ABSTRACT

A semiconductor device has a memory cell array including a plurality of memory cells, each of which includes first and second transistors and connected in series between a bit line for normal access only and a bit line for refreshing only, and a capacitor connected to a connection node at which the first and second transistors are tied. A word line for normal access only and a word line for refreshing only are connected to control terminals of the first and second transistors, respectively. The semiconductor memory device has a late-write configuration in which writing to a memory cell at an externally input write address is performed, being delayed by a predetermined number of write cycles exceeding at least one, and has at least a circuit for checking whether the write address externally input the predetermined number of write cycles earlier matches the refresh address.

30 Claims, 11 Drawing Sheets

HIGH-SPEED, TWO-PORT DYNAMIC RANDOM ACCESS MEMORY (DRAM) WITH A LATE-WRITE CONFIGURATION

FIELD OF THE INVENTION

The present invention relates to a semiconductor memory device. More specifically, the invention relates to a dynamic semiconductor memory device suitable for being applied to a semiconductor memory device compliant with a high-speed SRAM semiconductor memory device of a clock synchronous type, and its control method.

BACKGROUND OF THE INVENTION

ZBT (zero bus turnaround) is a synchronous SRAM architecture optimized for a switching function and a router function that require frequent and highly random read and write operations, for example, in networking and telecommunications applications. A ZBT SRAM device is useful for removing an idling state that might be encountered during access to a data bus through which switching between write and read operations is frequently performed. In other words, the ZBT SRAM device removes a dead cycle and enables use in a maximum memory bandwidth.

While a DRAM device requires a periodic refresh operation and a pre-charge operation for a bit line, an SRAM device is excellent in terms of a data access cycle. In the SRAM device, each cell is composed by four or six transistors. In a high resistive load type cell, the four transistors are constituted of two selection transistors connected to a pair of bit lines and two transistors having their gates and drains cross-connected to each other, while a CMOS type cell is constituted from the six transistors. The DRAM device is constituted from one transistor and one capacitor. It means that a DRAM is superior to an SRAM in a die area, power dissipation, and a cost. Thus, there is proposed an enhanced bus turnaround DRAM which aims at improvements in device integration, power dissipation, and the cost as well as provides advantages of a conventional ZBT SRAM device having a pin arrangement, timing and function similar to those of the SRAM (refer the following reference 1 (termed as a Patent Document 1)).

[Patent Document 1]

JP Patent Kokai Publication No. JP-P2001-283587A (p. 2, FIG. 1)

A memory device described in the above Patent Document 1 includes a WAIT signal output pin that informs to a controller outside the memory device that a memory array is in a state which cannot be used for data access. The above Patent Document 1 describes an object of providing the enhanced bus turnaround DRAM with the pin arrangement, the timing, and function sets similar to those of the ZBT SRAM device and having same advantages as the ZBT SRAM device. However, the device is not ZBT-SRAM compatible. In the above Patent Document 1, use of a two-port DRAM cell is not described, and a usual one-port DRAM cell is considered to be used. There is a need to always insert a refresh cycle between read/write cycles; and in the refresh cycle, read/write operations must be interrupted. When the DRAM is applied to communications, specifications for enabling continuous read/write operations are required. In such communications applications, the conventional ZBT SRAM cannot be replaced by the enhanced bus turnaround DRAM described in the above Patent Document 1. In a paragraph [0059] in a detailed description of the above Patent Document 1, there is such a description that when the refresh cycle is hidden behind a readout cycle of a cache, an effect of almost every refresh cycles on the operation of the memory device is made minimum. However, in case where read/write requests for data not on the cache in the memory array continually occur, even though the occurrence of such a case is not frequent, the read/write operations had to be interrupted by using the WAIT terminal, as a result of which the ZBT SRAM cannot be replaced by the enhanced bus turnaround DRAM.

On the other hand, as shown in FIG. 11, there is known a dynamic random access memory (refer the following reference 2 (Patent Document 2), for example). This memory includes a cell array which has a plurality of memory cells, each of which is a two-port DRAM cell. In each two-port memory cell, first and second switch transistors 205 and 206 are connected in series between a bit line 201 for normal access and a bit line 202 for refreshing only. A capacitor element 207 for storing data is connected to a connection node at which the first and second switch transistors 205 and 206 are tied. A word line 204 for normal access and a word line 203 for refreshing are connected to respective control terminals of the first and second switch transistors 205 and 206. In this memory, when an external memory access and a refresh are made in a overlapped timing to an identical address, the refresh is masked.

There is also known a memory (refer the following reference 3 (Patent Document 3), for example). In this memory, the two-port DRAM cells shown in FIG. 11 are employed; and bit lines dedicated for write and bit lines dedicated for read are provided, and read and write operations are simultaneously performed. For a refresh, cell data is read from the corresponding bit line dedicated for read, and amplified by a sense amplifier. Then, the cell data is written back through the corresponding bit line dedicated for write.

[Patent Document 2]

JP Patent Kokai Publication No. JP-A-3-263685 (p. 2, FIG. 2)

[Patent Document 3]

JP Patent No. 2653689 (p. 3, FIG. 2)

SUMMARY OF THE DISCLOSURE

A device that uses conventional DRAM cells, similar to the ZBT SRAM, (also called as an "NoBL-SRAM") has been developed. In this device, it becomes necessary to deselect four clock cycles for each 16 $\mu$s for performing an auto-refresh, for example; thus, it is not completely ZBT-SRAM-interface compatible (refer the following reference 4 (Non-patent Document 1), for example). Presence of a deselect period makes it difficult to increase access efficiency.

[Non-patent Document 1]

Enhanced Memory Systems Inc. Web Page Products News (Products New) [Searched on Oct. 10, 2002] Via Internet <URL:http://www.edram.com/products/datasheets/ss2625ds_rl.l.pdf (p. 6)>

Accordingly, it is an object of the present invention to provide a semiconductor memory device that is interface compatible with a high-speed SRAM such as a ZBT SRAM and its control method, which can improve the efficiency of refresh control in the semiconductor memory device to realize a high speed operation.

The above and other objects are attained by a semiconductor memory device according to one aspect of the present invention comprises: a cell array including a plurality of memory cells, each of which comprises: first and second switch transistors connected in series between a bit line for normal access and a bit line for refreshing; and a capacitor for data storage, connected to a connection point between the first and second switch transistors; in which a word line for normal access and a word line for refreshing are connected to respective control terminals of the first and second switch transistors. The semiconductor memory device, which is configured as a late-write configuration in which a write to a memory cell selected by a write address input to the semiconductor memory device from an outside of the semiconductor memory device is performed, being delayed by at least one write cycle from input of the write address, comprises a determination circuit for comparing a refresh address with a row address of the write address externally input the at least one write cycle earlier to detect whether the refresh address matches the row address or not; and a control unit for performing control so that when a mismatch is detected as a result of the determination, a write operation and a refresh operation are concurrently performed during a same cycle, the write operation being performed by activating the word line for normal access selected by the write address, turning on the first switch transistor for the memory cell connected to the word line for normal access, and writing data to the capacitor through the bit line for normal access, the refresh operation being performed by activating the word line for refreshing selected by the refresh address, turning on the second switch transistor for the memory cell connected to the word line for refreshing, and reading cell data and writing back the cell data through the bit line for refreshing using a sense amplifier for refreshing connected to the bit line for refreshing, and when the match is detected as the result of the determination, the refresh operation is inhibited and the write operation is performed.

According to one aspect of the present invention, preferably, the determination circuit compares the refresh address with the row address of the write address to detect whether the refresh address matches the row address of the write address or not before a cycle of performing the write operation on the cell array is started.

A method in accordance with another aspect of the present invention relates to refreshing control of a semiconductor memory device. In the method of controlling the semiconductor memory device having a cell array including a plurality of memory cells, each of the memory cells comprising: first and second switch transistors connected in series between a bit line for normal access and a bit line for refreshing; and a capacitor for data storage, connected to a connection point between the first and second switch transistors; a word line for normal access and a word line for refreshing being connected to respective control terminals of the first and second switch transistors, wherein the semiconductor memory device having a late-write configuration in which a write to a memory cell selected by a write address input to the semiconductor memory device from an outside of the semiconductor memory device is performed, being delayed by at least one write cycle. The method comprises the steps of:

(a) comparing a generated refresh address with the write address externally input the at least one write cycle earlier to detect whether the refresh address matches the write address or not;

(b) performing control so that when a mismatch is detected as a result of the determination, a write operation and a refresh operation are concurrently performed during a same cycle, the write operation being performed by activating the word line for normal access selected by the write address, turning on the first switch transistor for the memory cell connected to the word line for normal access, and writing data to the capacitor through the bit line for normal access, the refresh operation being performed by activating the word line for refreshing selected by the refresh address, turning on the second switch transistor for the memory cell connected to the word line for refreshing, and reading cell data and writing back the cell data through the bit line for refreshing using a sense amplifier for refreshing connected to the bit line for refreshing; and (c) performing control so that when there is the match as the result of the determination, the refresh operation is inhibited and the write operation is performed.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
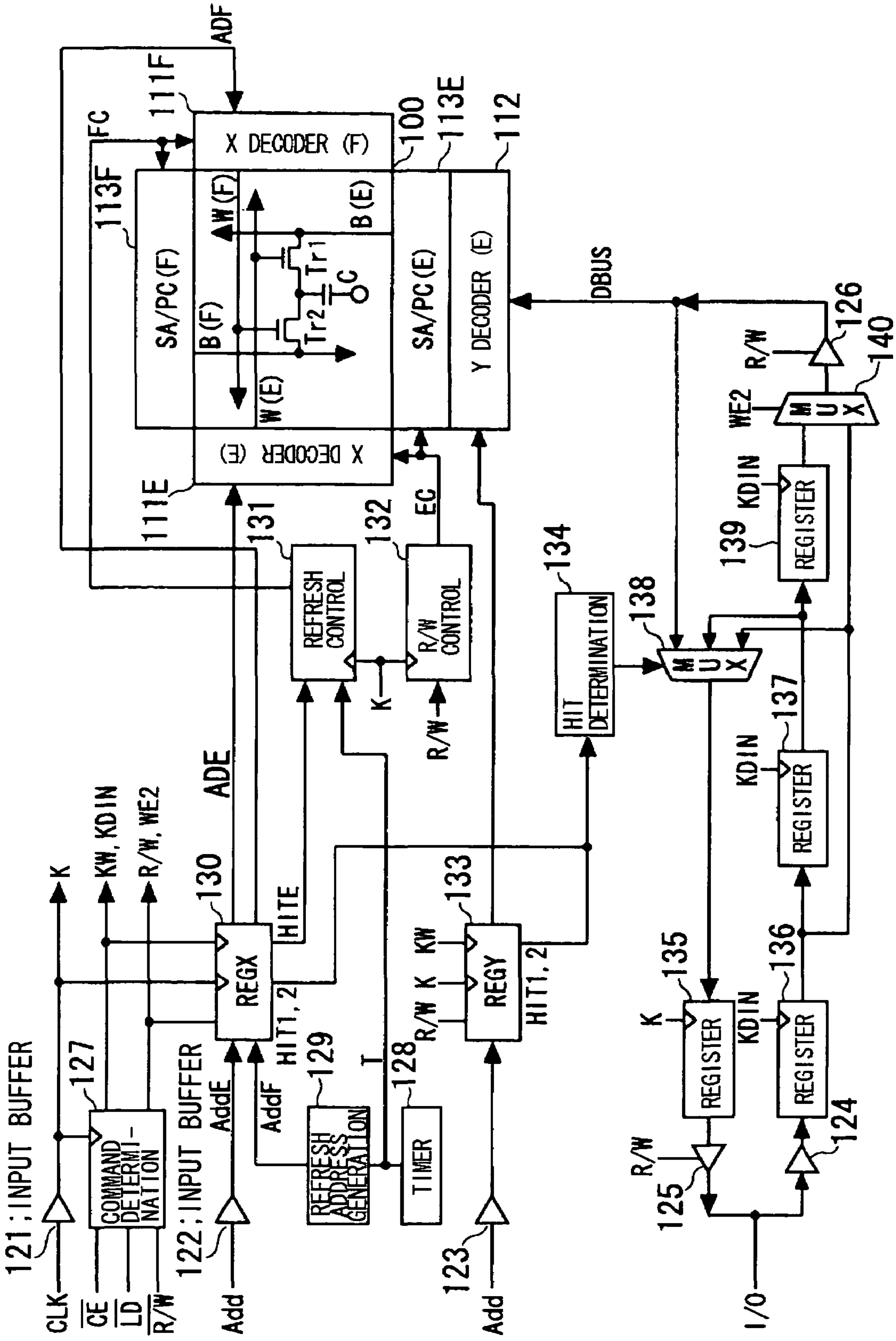
FIG. 1 is a diagram showing a cell array and an overall configuration of a semiconductor memory device according to an embodiment of the present invention.

Embodiments for practicing the present invention will be described. Referring to FIG. 1, in a semiconductor memory device in an embodiment, each memory cell includes first and second switch transistors (Tr1 and Tr2) connected in series between a bit line (B(E)) for normal access and a bit line (B(F)) for refreshing and a capacitor (C) for data storage connected to a connection node at which the first and second switch transistors (Tr1 and Tr2) are tied. A word line (W(E)) for normal access and a word line (W(F)) for refreshing are connected to control terminals of the first and second switch transistors (Tr1 and Tr2), respectively. The semiconductor memory device has a late-write configuration in which writing data to a memory cell at an externally input write address is performed with a delay by a predetermined number of write cycles exceeding one.

The semiconductor memory device according to the preferred embodiment of the present invention includes at least a determination circuit (130) for comparing a generated refresh address with a write address externally supplied to an address terminal of the semiconductor memory device the predetermined number of write cycles exceeding one earlier and held for a period corresponding to the predetermined number of write cycles to detect whether there is a match in the two addresses or not. Based on an output signal (HITE) which indicates the check result by the determination circuit (130), if a mismatch has been detected, a refresh operation on a memory cell specified by the refresh address and a normal write operation on the write address are concurrently performed during a same cycle. In the refresh operation, a refresh control circuit (131) activates a refresh control signal (FC) to thereby activate a word line for refreshing. A second cell transistor of the memory cell connected to the word line is then turned on. Then, the refresh operation is performed using a sense amplifier for refreshing (113F) connected to a bit line for refreshing. In the normal write operation, a word line for normal access associated with the write address is selected, a first cell transistor of a memory cell connected to the word line is turned on, and a write operation of data to the memory cell through a bit line for normal access is performed.

In the semiconductor memory device according to an embodiment of the present invention, the determination circuit (130) for outputting a determination result (HITE) includes a write address holding circuit (latch circuits 322 to 325 in FIG. 5, for example) for holding an address (row address) externally supplied to the address terminal and delaying the address by the predetermined number of write cycles, a selection circuit (326 in FIG. 5) which selects the externally input address in case of a control signal (R/W) indicating a read operation and selects an address output from the write address holding circuit in case of the control signal (R/W) indicating a write operation, to output the selected address to a row decoder circuit (111E in FIG. 1) and a match detection circuit (332 in FIG. 5) for comparing an address output from the write address holding circuit (the latch circuit 324 in FIG. 5) with a refresh address to detect whether the address output from the write address holding circuit matches the refresh address. The match detection circuit (332 in FIG. 5) compares the write address at a point in time before output delayed by the predetermined number of write cycles is performed (an output of the latch circuit 324 in front of the latch circuit 325 at a final stage of the write address holding circuit) with the refresh address to detect whether the write address matches the refresh address or not. That is, before a cycle, in which a write operation on a cell array is performed, is initiated, comparison and checking as to whether the refresh address matches the write address are made.

In the semiconductor memory device according to the embodiment mode of the present invention, the write address holding circuit is configured using pairs of latch circuits connected in cascade connection, each pair of the latch circuits (such as 322, 323 in FIG. 5) sampling data at a falling or a rising edge of a clock signal (KW) for write control. The number of the pairs of the latch circuits (constituted from a pair of the latch circuits 322 and 323 and a pair of the latch circuits 324 and 325, totaling four stages in FIG. 5) corresponds to the predetermined number of cycles. The latch circuit at the final stage (the latch circuit 325 in FIG. 5) constituting the write address holding circuit outputs a write address to the selection circuit (326) at a rise of the clock signal (KW) for write control (at a timing associated with a delay of two write cycles after sampling by a latch circuit 320).

Alternatively, the semiconductor memory device according to another embodiment of the present invention preferably include a match detection circuit (307 in FIG. 2) for comparing an address output from a selection circuit (306 in FIG. 2) with the refresh address to detect whether the address output from the selection circuit matches the refresh address.

A semiconductor memory device according to another embodiment of the present invention preferably includes a write address holding circuit (341, 342, 343, 344 in FIG. 8) for delaying an externally supplied address (AddE) by the predetermined number of write cycles, a first selection circuit (345 in FIG. 8) for selecting the externally input address when the control signal for commanding read/write operation, indicates a read and for selecting a write address output from the write address holding circuit (344 in FIG. 8) when the control signal indicates a write to supply the selected address to the row decoder circuit, a first match detection circuit (351 in FIG. 8) for comparing the externally supplied address (AddE) with a refresh address (AddF) to detect whether the externally input address matches the refresh address or not, a second match detection circuit (352 in FIG. 8) for comparing a write address (the output of the latch circuit 343 in FIG. 8) held in the write address holding circuit and at a point of time before output delayed by the predetermined number of write cycles is performed, with the refresh address (AddF) to detect whether the write address matches the refresh address or not, and a second selection circuit (353, 354 in FIG. 8) for selecting an output signal of the first match detection circuit for a read and the output signal of the second match detection circuit for a write, based on the value of the control signal commanding the read/write operation. The output signal of the second selection circuit is employed as the hit signal (HITE) constituting the output of the determination circuit.

A semiconductor memory device according to the embodiment mode of the present invention includes circuits (401 to 404 in FIG. 6) for performing control so that the refresh control signal (FC) is activated when there is any one bit indicating a mismatch between the externally input write address (AddE) delayed by the predetermined number of write cycles and the refresh address (AddF) after the result of determination by the determination circuit (130). At this point, the write operation associated with the write address and the refresh operation are concurrently performed. On the other hand, when the externally supplied write address AddE delayed by the predetermined number of write cycles matches the fresh address AddF in all bit positions (when HITEs are all active for the bits of the row address), the refresh control signal FC is deactivated. For this reason, only the write operation is performed.

The semiconductor memory device according to the embodiment of the present invention may include a comparator (308, 309 in FIG. 2) for respectively comparing a write address delayed at the write address holding circuit by the predetermined number of write cycles or by the number of cycles less than the predetermined number of write cycles with an externally input address signal to detect whether the write address matches the externally input address signal. The semiconductor memory device may further include a control unit (134, 138 in FIG. 1) for performing control so that write data associated with the write address, held at data holding circuits (136, 137 in FIG. 1), waiting for writing is output to a data output terminal as read data when the write address delayed at the write address holding circuit by the predetermined number of write cycles or by the number of cycles less than the predetermined number of write cycles matches a read address externally input this time.

The semiconductor memory device according to the embodiment of the present invention preferably includes a timer (128 in FIG. 1) for generating a trigger signal defining a refresh cycle and a refresh address generation circuit (129 in FIG. 1) for generating a refresh address based on the trigger signal from the timer, has a self-refresh function, and is made to be compatible with an interface for a clock synchronous type static random access memory.

In the semiconductor memory device according to the embodiment of the present invention, a word line W(E) for normal access is connected to a first X decoder (111E in FIG. 1) for decoding a row address of an externally supplied address, and the word line W(F) for refreshing is connected to a second X decoder (111F in FIG. 1) for decoding a refresh address. The first and second X decoders are disposed to be opposite to each other with the cell array interposed therebetween. The bit line B(E) for normal access is connected to a first sense amplifier (113E), the bit line B(F) for refreshing is connected to the second sense amplifier (113F) for refreshing, and the first and second sense amplifiers are disposed to be opposite to each other with the cell array interposed therebetween.

In the semiconductor memory device according to the present invention, the row address signal of an externally input read address are compared with a refresh address from the refresh address generation circuit. If they do not match, reading data from a cell selected by the read address and the refresh operation on the cell array, selected by the refresh address may be performed simultaneously. If they match, the refresh operation may be inhibited, thereby performing data reading from the cell array, selected by the read address.

In the semiconductor memory device according to the embodiment of the present invention, two-port DRAM cells are used. A read/write and a refresh can be thereby performed simultaneously. For this reason, in the semiconductor memory device according to the embodiment modes of the present invention, the read/write operation can be continuously performed without interruption caused by the refresh. Accordingly, as a ZBT-SRAM compatible semiconductor device, the present invention is applicable to communications use as well for which specifications capable of performing a continuous read/write operation are required. On the other hand, as described before, there is no description about use of the two-port DRAM cell in the Patent Document 1; thus, there is a need to always insert a refresh cycle between read write/cycles, so that replacement by a conventional ZBT SRAM for the communications use cannot be performed.

Embodiments

The embodiments of the present invention described above will be described in more detail with reference to drawings. FIG. 1 is a block diagram showing a clock synchronous type semiconductor memory device according to an embodiment of the present invention. A cell array is constituted from a plurality of DRAM cells and is interface compatible with a clock synchronous type SRAM compliant with ZBT specifications, for example.

Referring to FIG. 1, in a cell array 100 having a plurality of memory cells, each memory cell includes first and second memory cell transistors (switch transistors) Tr1 and Tr2 which are connected in series between a bit line B(E) for normal access and a bit line B(F) for refreshing and a capacitor element C for data storage. One terminal of the capacitor element C is connected to a connection node at which the first and second memory cell transistors Tr1 and Tr2 are tied, and an other terminal of the capacitor element C is connected to, for example, a GND potential. Gate terminals of the first and second memory cell transistors Tr1 and Tr2 are connected to a word line W(E) for normal access and a word line W(F) for refreshing, respectively.

A first word line W(E) for normal access is connected to a word driver (not shown) for an X decoder 111E for decoding a row address input to an address terminal from an outside of the semiconductor memory device. A second word line W(F) for refreshing is connected to the word driver (not shown) for an X decoder 111F for decoding a column address of a refresh address.

The two X decoders 111E and 111F are disposed to be opposite to each other with the cell array 100 interposed therebetween.

The bit line B(E) for normal access is connected to a sense amplifier/pre-charging circuit 113E for an external address, while the bit line B(F) for refreshing is connected to a sense amplifier/pre-charging circuit 113F for a refresh address. The sense amplifiers 113E and 113F are disposed to be opposite to each other with the cell array 100 interposed therebetween.

An input buffer 121 that receives a clock signal CLK supplied to a clock terminal of the semiconductor memory device from the outside of the semiconductor memory device outputs an internal clock signal K.

An input buffer 122 that receives the row address indicated by an address signal Add supplied to the address terminal of the semiconductor memory device from the outside of the semiconductor memory device outputs an AddE which is a row address.

A command determination circuit 127 receives a chip enable signal /CE that is active at a LOW level, a load signal /LD signal that is active at the LOW level, /(R/W) that is active at the LOW level and indicates a read at the LOW level and a write at a HIGH level, decodes a command, and outputs a read/write command R/W, a write enable signal WE2, and clock signals KW and KDIN. A symbol "/" located at a position preceding a signal name (or a terminal name) corresponds to a bar over the signal name (or the terminal name) in the drawing, and indicates that the signal is active at the LOW level.

A timer 128 is a timer that generates a refresh trigger signal for defining a refresh cycle. The refresh trigger signal is referred to as a trigger signal. The timer 128 is composed by a counter not shown. The counter composing the timer 128 outputs an overflow signal as the trigger signal, every time whenever the counter has counted up a predetermined value, automatically accomplishes reset operation, and then performs a counting-up operation from "zero".

A refresh address generation circuit 129 is composed by a counter (not shown) that increments a count value upon reception of the trigger signal from the timer 128. The count value is output as a refresh address.

A register 130 receives the external address (row address) AddE from the input buffer 122 and a refresh address AddF from the refresh address generation circuit 129, holds these address, checks whether a write address and the refresh address matches with each other or not, and outputs a check result as a signal HITE.

The register 130 also holds the write address which is supplied externally, supplies to the X decoder 111E an address signal ADE delayed by two write cycles for a late write, and supplies a read address to the X decoder 111E without alteration. The register 130 further supplies a latched refresh address signal ADF to the X decoder 111F for refreshing only.

The register 130 activates a signal HIT1 when a row address which is input externally matches the row address which was input one write cycle earlier and held in the register 130, and activates a signal HIT2 when the row address input externally matches the row address input two write cycles earlier and held in the register 130.

A refresh control circuit 131 receives from the register 130 (the hit signal HITE indicating the result of determination whether a write address matches a refresh address), samples the trigger signal T from the timer 128 at a rising edge of the internal clock signal K, for example, to generate a refresh control signal FC, and supplies the refresh control signal FC to the X decoder 111F and the sense amplifier/pre-charging circuit 113F.

An R/W control circuit 132 samples the read/write command signal R/W from the command determination circuit 127 in response to the internal clock signal K, and supplies an access control signal EC to the X decoder 111E and the sense amplifier/pre-charging circuit 113E. The X decoder 111E activates a selected word line for a predetermined period, based on the access control signal EC. Activation of the sense amplifier 113E is controlled, based on the access control signal EC. The sense amplifier/pre-charging circuit 113E pre-charges the bit line B(E) before activation of the word line in a read cycle. An input buffer 123 receives an address signal supplied to the address terminal (not shown). A register 133, which receives an output (a column address) of the input buffer 123, receives the read/write command signal R/W and the write control clock signal KW. Then the register 133 delays the write address (column address) by two write cycles and then outputs the delayed write address, and outputs a read address to a Y decoder 112 without alteration.

The register 133 activates the signal HIT1 when a column address externally input is the same as the column address supplied one write cycle earlier, and activates the signal HIT2 when the column address externally input is the same as the column address supplied two write cycles earlier.

A HIT determination circuit 134 receives respective signals of the signals HIT1 and HIT2 from the registers 130 and 133 and outputs a selection control signal to a multiplexer 138 for selecting data to be supplied to a circuit that outputs read data.

An output signal (write data) from an input buffer 124 connected to an I/O terminal is sampled by a register 136 that uses the clock signal KDIN (output from the command determination circuit 127) as a sampling clock. The output signal of the register 136 is sampled by a register 137 that uses the clock signal KDIN as the sampling clock. The output signal of the register 137 is sampled by a register 139 that uses the clock signal KDIN as the sampling clock. The output signals of the registers 136 and 137 are supplied to two respective terminals of the multiplexer 138.

The output signals of the registers 136 and 139 are supplied to the two respective input terminals of the multiplexer 140. The multiplexer 140 selects one of the output signals based on the selection control signal WE2, and its output signal is supplied to a tri-state buffer 126. The multiplexer 140 selectively outputs the output signal of the register 139 when the write enable signal WE2 is activated (for the late write delayed by the two write cycles) and selectively outputs the output signal of the register 136 when the write enable signal WE2 is deactivated.

When the signals HIT1 from the registers 130 and 133 are both activated and the read address is the same as the one for an immediately preceding write cycle, the HIT determination circuit 134 performs control so that the multiplexer 138 selectively outputs the output of the register 136.

When the signals HIT2 from the registers 130 and 133 are both activated and the read address is the same as the one two write cycles earlier, the HIT determination circuit 134 performs control so that the multiplexer 138 selects the output of the register 137.

In other read cycles, the HIT determination circuit 134 performs control so that the multiplexer 138 selects read data output onto a data bus DBUS via sense the amplifier/pre-charging circuit 113E and a Y switch (not shown: selected by the Y decoder 112).

The tri-state buffer 126 is enabled for output when the R/W signal indicates a write operation, and the output of the tri-state buffer 126 is set to a high impedance state when the R/W signal indicates a read operation.

The output of the tri-state buffer 126 is connected to the data bus DBUS, and write data is supplied to the Y decoder 112 through the data bus DBUS.

The data bus DBUS between the Y decoder 112 and the tri-state buffer 126 is connected to the multiplexer 138. As described before, the multiplexer 138 controls selection among three signals supplied to the multiplexer 138 as inputs, based on the selection control signal from the HIT determination circuit 134.

The output of the multiplexer 138 is supplied to a register 135, and is sampled by the register 135 with the internal clock signal K. The output of the register 135 is output from the I/O terminal via an output buffer 125 composed by a tri-state buffer that is made output-enabled when the R/W signal indicates a read operation.

An overview of an operation of the present embodiment will be described. The register 130 compares a refresh address from the refresh address generation circuit 129 with a write address output from the input buffer 122 two write cycle earlier and held in the register 130. If the refresh address matches the write address, the signal HITE is activated. If a mismatch has been detected, the signal HITE is deactivated.

The refresh control circuit 131 activates the refresh control signal FC when the signal HITE from the register 130 is deactivated (or more specifically, when any one of m row addresses does not match the refresh address signal). The R/W control circuit 132 activates the control signal EC in response to a read or write command. The operation of writing data to a memory cell with the write address which has been supplied two write cycles earlier and the operation of refreshing the memory cell by using the X decoder for refreshing, the bit line B(F), and the sense amplifier SA/PC (F) 113F are simultaneously performed. The data associated with the write address is input from the I/O terminal two write cycles earlier, output from the register 139, and supplied to the Y decoder 112 through the multiplexer 140, buffer 126, and the data bus DBUS. The operation of writing the data is performed by using the X decoder 111E, bit line B(E), and sense amplifier (write amplifier) SA/PC (113E).

As described before, the register 130 makes the HIT1 or the HIT2 active when a write address (row address) externally input one or two write cycles earlier and held in the register 130 matches an externally input address (row address). The register 133 makes the HITI or the HIT2 active when a write address (column address) externally input one or two write cycles earlier and held in the register 133 matches an externally input address (column address).

When the HIT1 and the HIT2 from the registers 130 and 133 are deactivated, the HIT determination circuit 134 causes the multiplexer 138 to selectively output read data output onto the data bus DBUS. The output of the multiplexer 138 is latched by the register 135 and output to the I/O terminal through the output buffer 125.

When row and column addresses for a write address input one or two write cycles earlier match the row and column addresses for a read address externally input, the HIT1 or the HIT2 from the registers 130 and 133 are activated.

When the signal HIT1 is activated, the multiplexer 138 selects write data held in the register 136 as read data. On the other hand, when the signal HIT2 is activated, the multiplexer 138 selects write data held in the register 137 as the read data. The output of the multiplexer 138 is latched by the register 135 and output to the I/O terminal through the output buffer 125.

Figure 2:
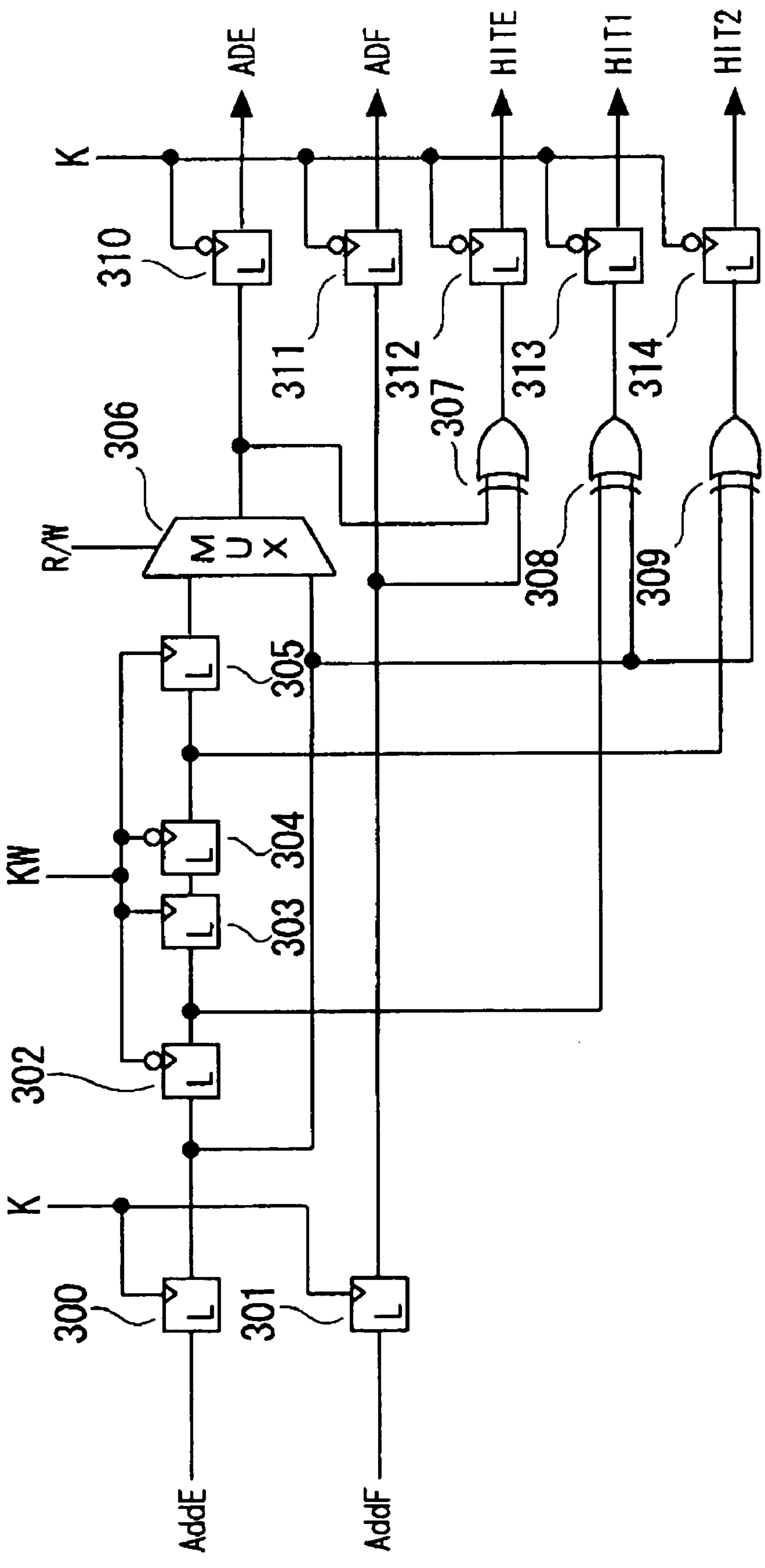
FIG. 2 is a diagram showing a configuration of a register (REGX) according to the embodiment of the present invention.

Some examples of a configuration of the register 130 in FIG. 1 will be described below. FIG. 2 is a block diagram showing an example of the configuration of the register 130 in FIG. 1.

Referring to FIG. 2, the register 130 includes latch circuits 300, 301, 302, 303, 304, 305, and 310, and a multiplexer 306. The latch circuit 300 samples the external address AddE at the rising edge of the internal clock signal K. The latch circuit 301 samples the refresh address AddF at the rising edge of the internal clock signal K. The latch circuit 302 samples the output signal of the latch circuit 300 at an edge of falling of the write control clock signal KW (that occurs during a same cycle as for rising of the internal clock signal K). The latch circuit 303 samples the output signal of the latch circuit 302 at the edge of rising of the write control clock signal KW (in a next write cycle after falling of the clock signal KW). The latch circuit 304 samples the output signal of the latch circuit 303 at the falling edge of the write control clock signal KW. The latch circuit 305 samples the output signal of the latch circuit 304 at the rising edge of the write control clock signal KW. The multiplexer 306 receives the output signals of the latch circuits 300 and 305, selects the output signal of the latch circuit 300 when the R/W signal indicates a read operation, and selects the output signal of the latch circuit 305 when the R/W signal indicates a write operation. The latch circuit 310 samples the output signal of the multiplexer 306 at the falling edge of the internal clock signal K.

The output of the latch circuit 310 is supplied to the X decoder 111E as the external address signal ADE. The register 130 further includes a latch circuit 311 that samples the output signal of the latch circuit 301 at the falling edge of the internal clock signal K. The output of the latch circuit 311 is supplied to X decoder the 111F for refreshing as the refresh address signal ADF.

Referring to FIG. 2, the register 130 (refer to FIG. 1) further includes match detection circuits 307, 308, and 309, and latch circuits 312, 313, and 314 that sample the respective output signals of the match detection circuits 307, 308, and 309 at the falling edge of the internal clock signal K.

The match detection circuit 307 compares the output signal of the latch circuit 301 for latching the refresh address AddF with the output signal of the multiplexer 306 to detect whether they match with each other. When the match has been detected, the match detection circuit 307 outputs the LOW level. In this embodiment, the match detection circuit is constituted from a two-input exclusive OR gate.

The match detection circuit 308 compares the output signal of the latch circuit 300 for latching the external address with the output signal of the latch circuit 302 for sampling the output signal of the latch circuit 300 at the falling edge of the write control clock signal KW to detect whether they match with each other or not. When the match has been detected, the match detection circuit 308 outputs the LOW level.

The match detection circuit 309 compares the output signal of the latch circuit 300 with the output of the latch circuit 304 (the write address two cycles earlier) to detect whether the output signal matches the output or not. When the match has been detected, the match detection circuit 309 outputs the LOW level.

The outputs of the latch circuits 312, 313, and 314 are output as the signals HITE, HIT1, and HIT2.

The latch circuits 300 and 301 latch the address AddE and the refresh address AddF, respectively, at an edge of the internal clock signal K rising from the LOW to the HIGH level. The latch circuits 310 to 314 at an output stage latch their respective inputs at an edge of the internal clock signal K falling from the HIGH level to the LOW level during the same cycle to output the latched address.

In this case, a pair of the two latch circuits 302 and 303 and a pair of the two latch circuits 304 and 305, of which the latch circuits 302 and 304 sample data at the falling edge of the clock signal (KW) for write control and the latch circuits 303 and 305 sample data at the rising edge of the clock signal (KW) for write control, function as a write address holding circuit (also referred to as a "late-write register") for timing adjustment, which delays the write address by two write cycles according to specifications for the late write. The latch circuit 305 at a final stage which constitutes the write address holding circuit outputs the write address to the multiplexer at the rise of the clock signal KW for write control, at a point in time delayed by two write cycles after the write address has been sampled at the latch circuit 300.

Next, an operation of the register (indicated by reference numeral 130 in FIG. 1) shown in FIG. 2 will be described. At a time of a read operation, the R/W signal indicates a read, and at the multiplexer 306 that receives the R/W signal as the selection control signal, the output signal of the latch circuit 300 is selected, and the row address signal ADE is supplied from the latch circuit 310. Further, the output signal of the latch circuit 311 that latches the output signal of the latch circuit 301 at the falling edge of the internal clock signal K is output as the refresh address ADF. The latch circuit 301 samples the refresh address AddF at the rise of the internal clock signal K. As described before, latching and output of the refresh address AddF by the latch circuits 301 and 311 are performed at the rise and fall of pulses of the internal clock signal K during the same cycle. At the time of the read operation, clock pulses of the clock signal KW are not generated (and the clock signal is kept at the LOW level, for example), and the output of the latch circuit 300 is not transferred to the four latch circuits 302, 303, 303, and 305.

At the time of a write operation, the R/W signal indicates a write operation, and at the multiplexer 306 that receives the R/W signal as the selection control signal, the output signal of the latch circuit 305 is selected, and the row address signal ADE is supplied from the latch circuit 310. Further, the output signal of the latch circuit 311 that latches the output signal of the latch circuit 301 at the falling edge of the internal clock signal K is output as the refresh address ADF. The latch circuit 301 samples the refresh address AddF at the rise of the internal clock signal K.

The match detection circuit 307 compares the output signal of the latch circuit 301 with the output signal of the multiplexer 306 (which is the output of the latch circuit 300 in case of a read operation, and is the output of the latch circuit 305 in case of a write operation) to detect whether they match or not. If the match has been detected, the match detection circuit 307 outputs the LOW level. If a mismatch has been detected, the match detection circuit 307 outputs the HIGH level.

The match detection circuit 308 compares the output of the latch circuit 302 (write address one write cycle earlier) with the output of the latch circuit 300 (address input during a current cycle) to detect whether they match or not. If the match has been detected, the match detection circuit 308 outputs the LOW level. If a mismatch has been detected, the match detection circuit 308 outputs the HIGH level.

The match detection circuit 309 compares the output of the latch circuit 304 (write address two write cycles earlier) with the output of the latch circuit 300 (address during the current cycle) to detect whether they match or not. If the match has been detected, the match detection circuit 309 outputs the LOW level. If a mismatch has been detected, the match detection circuit 309 outputs the HIGH level.

In FIG. 2, each address signal supplied to the latch circuits 300 to 305, 310 to 314, match detection circuits 307 to 309, and the multiplexer 306, are drawn as a single signal line only for simplicity. However, signal lines, the number of which corresponds to a bit width of the row address (such as m signal lines) are respectively supplied to these circuits. The same holds true in FIGS. 3, 5, and 8, which will be described later.

Figure 3:
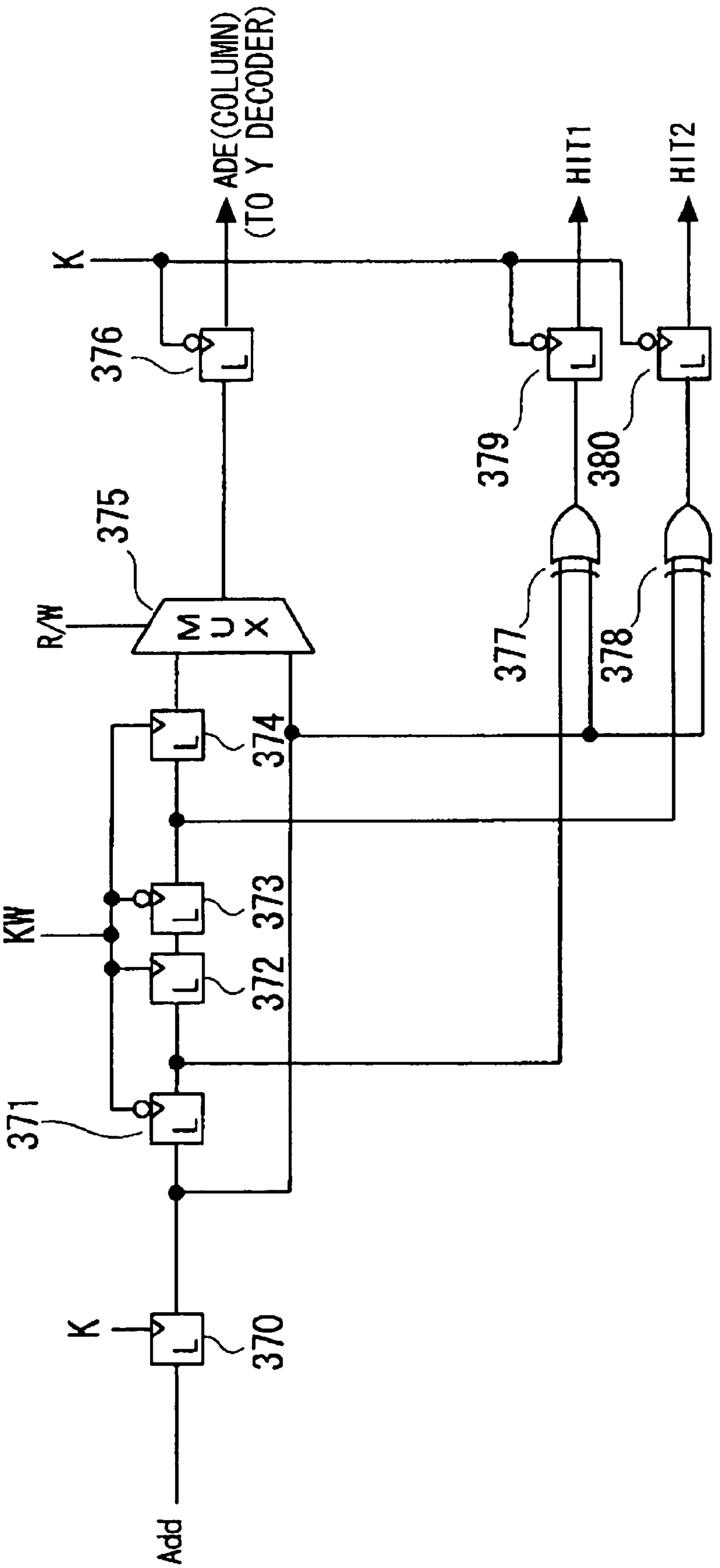
FIG. 3 is a diagram showing a configuration of a register (REGY) according to the embodiment of the present invention.

FIG. 3 is a block diagram showing an example of the configuration of the register 133 in FIG. 1 for latching a column address to provided latched address to the Y decoder 112. Referring to FIG. 3, the register 133 includes latch circuits 370, 371, 372, 373, 374, 376, 379, and 380, a multiplexer 375, and match detection circuits 377 and 378. The latch circuit 370 samples the external address Add at the rising edge of the internal clock signal K. The latch circuit 371 samples the output signal of the latch circuit 370 at the falling edge of the write control clock signal KW. The latch circuit 372 latches the output signal of the latch circuit 371 at the rising edge of the write control clock signal KW. The latch circuit 373 samples the output signal of the latch circuit 372 at the falling edge of the write control clock signal KW. The latch circuit 374 samples the output signal of the latch circuit 373 at the rising edge of the write control clock signal KW. The multiplexer 375 receives the output signals of the latch circuits 370 and 374, selects the output signal of the latch circuit 370 when the R/W signal indicates a read operation, and selects the output signal of the latch circuit 374 when the R/W signal indicates a write operation. The latch circuit 376 samples the output signal of the multiplexer 375 at the falling edge of the internal clock signal K. The output signal of the latch circuit 376 is supplied to the Y decoder (indicated by reference numeral 112 in FIG. 1) as the external address signal (column address). The match detection circuit 377 compares the output signal of the latch circuit 370 with the output of the latch circuit 371 to detect whether they match or not. If the match has been detected, the match detection circuit 377 outputs the LOW level. The match detection circuit 378 compares the output signal of the latch circuit 370 with the output of the latch circuit 373 to detect whether they match or not. If the match has been detected, the match detection circuit 378 outputs the LOW level. The latch circuits 379 and 380 sample the output signals of the match detection circuits 377 and 378 at the falling edge of the internal clock signal K to output as the HITI and the HIT2, respectively.

The register 133 is configured by omitting the latch circuits (indicated by reference numerals 301 and 311 in FIG. 2) for latching the refresh address signal and the circuits (indicated by reference numerals 307 and 312 in FIG. 2) for detecting whether the refresh address matches the output of the multiplexer 306 in the register 130 shown in FIG. 2.

An operation of the register (indicated by reference numeral 133 in FIG. 1) shown in FIG. 3 will be described. At the time of a reading operation, the R/W signal indicates a read operation, and at the multiplexer 375 that receives the R/W signal as the selection control signal, the output signal of the latch circuit 370 is selected, and the column address signal ADE is supplied from the latch circuit 376. Further, at the time of the read operation, no clock pulse of the clock signal KW is generated, so that the output of the latch circuit 370 is not transferred to the four latch circuits 371, 372, 373, and 374.

At the time of a write operation, the R/W signal indicates a write operation. At the multiplexer 375 that receives the R/W signal as the selection control signal, the output signal of the latch circuit 374 is selected, and the address signal (column address) ADE is supplied from the latch circuit 376.

The match detection circuit 377 compares the output of the latch circuit 371 (write address one write cycle earlier) with the output of the latch circuit 370 (address input during the current cycle) to detect whether they match or not. If the match has been detected, the match detection circuit 377 outputs the LOW level. If a mismatch has been detected, the match detection circuit 377 outputs the HIGH level.

The match detection circuit 378 compares the output of the latch circuit 373 (write address two write cycles earlier) with the output of the latch circuit 370 (address input during the current cycle) to detect whether they match or not. If the match has been detected, the match detection circuit 378 outputs the LOW level. If a mismatch has been detected, the match detection circuit 378 outputs the HIGH level.

Figure 4:
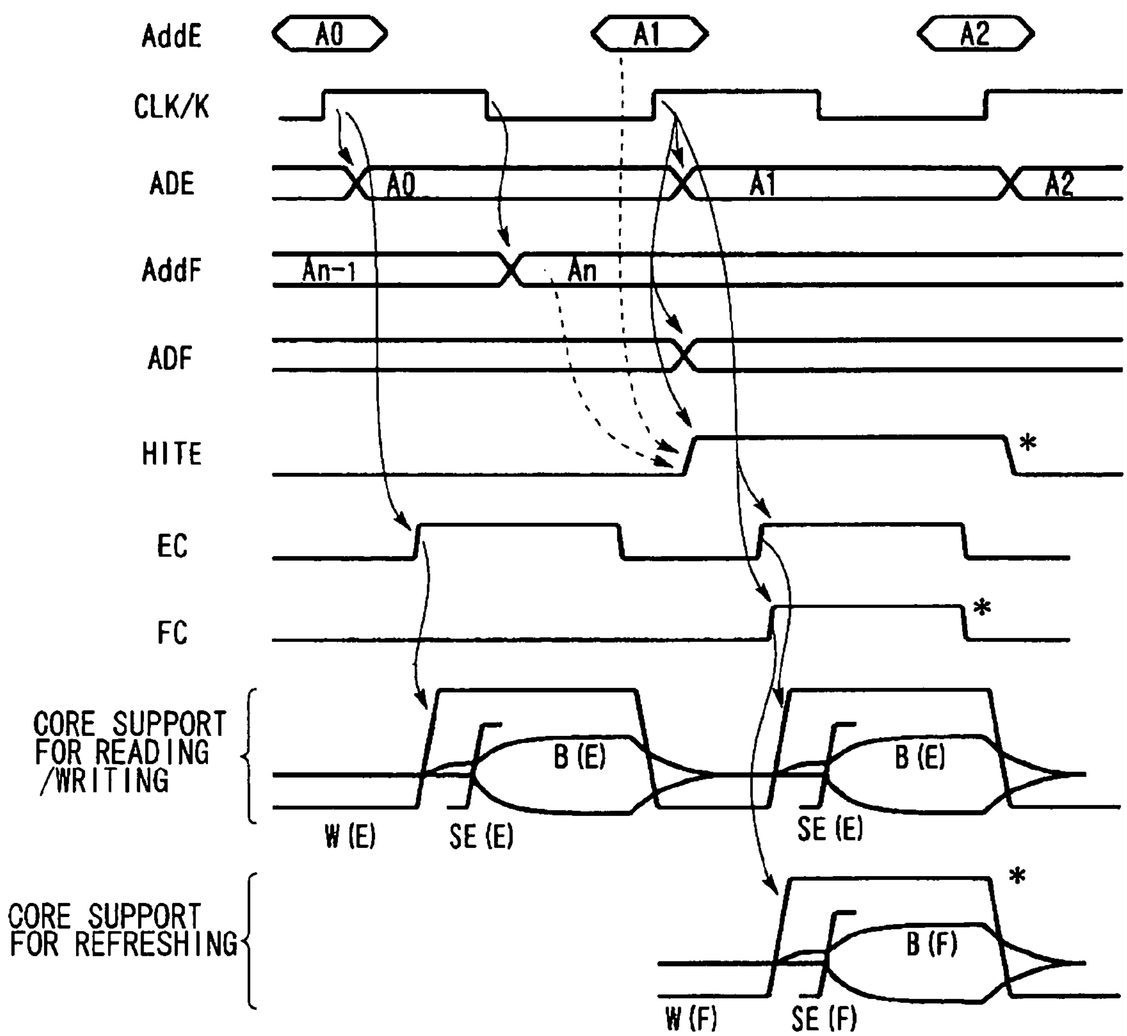
FIG. 4 is a timing waveform diagram for explaining an operation according to the embodiment of the present invention.

FIG. 4 is a timing diagram for explaining the operation of the semiconductor memory device shown in FIG. 1. Referring to FIG. 4, AddE denotes the output of the input buffer 122, CLK/K denotes a clock input to the input buffer 121 or a clock output from the input buffer 121, (which is the internal clock signal), ADE denotes the output of the register 130, AddF denotes the output of the refresh address generation circuit 129, ADF denotes the refresh address output from the register 130, and HITE is the signal (hit signal) indicating detection of a match, output from the register 130. EC denotes a usual access control signal, FC denotes the refresh control signal, W(E) denotes a word line for normal access, B(E) denotes a bit line for normal access, SE(E) denotes a sense enable signal for the sense amplifier 113E (in FIG. 1) for normal access, W(F) denotes a word line for refreshing only, B(F) denotes a bit line for refreshing, and SE(F) denotes the sense enable signal for the sense amplifier 113F for refreshing (in FIG. 1).

It is assumed that a write cycle is performed when the external row address is A0, A1, A2, or so on. The refresh address is assumed to be An−1, An, or so on.

When the signal HITE is LOW (when the refresh address AddF matches the write address AddE input two write cycles earlier or the read address AddE during the current cycle), the refresh control signal FC is not activated, and the normal access control signal EC is activated. The word line W(E) is thus activated, and activation of a sense amplifier SE(E) (a write amplifier not shown) is performed. Since the refresh control signal FC is not activated, refresh by activation of a sense amplifier SE(F) is not performed at a core port of a refreshing port.

When the external row address A1 is not equal to the (refresh address) An, the signal HITE is set to the HIGH level, which is indicated by a symbol "*". The normal access control signal EC is activated, the word line W(E) is activated, and a read by the sense amplifier SE(E) connected to the bit line B(E) (a write by the write amplifier at the time of writing) is performed at the core port for reading or writing. The refresh control signal FC is activated, (which is indicated by the symbol "*" and in this embodiment, corresponds to the HIGH level). The word line W(F) is activated, and a refresh by the sense amplifier SE(F) is performed at the core port of the refreshing port.

If activation of the sense amplifier SE(E) precedes activation of the sense amplifier SE(F), the activation of the sense amplifier SE(E) leads to power supply noise, thereby to adversely affect the bit line B(F) before the activation of the sense amplifier SE(F). On the contrary, if the activation of the sense amplifier SE(F) precedes the activation of the sense amplifier SE(E), the activation of the sense amplifier SE(F) leads to the power supply noise. The power supply noise propagates through a potential of the bit line B(E), thereby to adversely affect the bit line B(E). Accordingly, in the present embodiment, the internal clock signal K input to the refresh control circuit 131 and the R/W control circuit 132 performs control so that the activation of the sense amplifiers SE(E) and SE(F) is simultaneously started.

Figure 5:
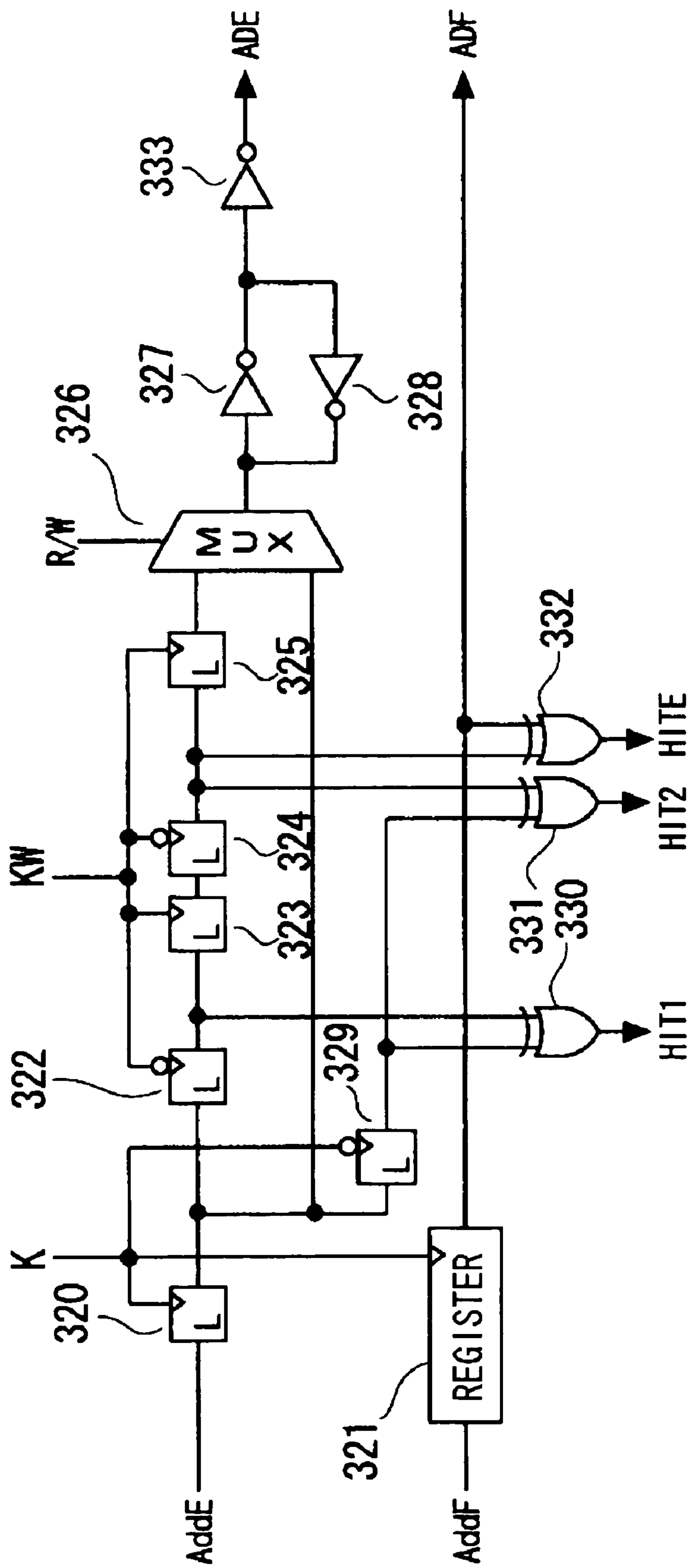
FIG. 5 is a diagram showing another configuration of the register (REGX) according to the embodiment of the present invention.

FIG. 5 is a block diagram showing another configuration of the register 130 in FIG. 1. Referring to FIG. 5, this register includes a latch circuit 320 for sampling the external address AddE at the rising edge of the internal clock signal K, a latch circuit 329 for sampling the output signal of the latch circuit 320 at the falling edge of the internal clock signal K, a register circuit (latch) 321 for sampling the refresh address AddF at the rising edge of the internal clock signal K, a latch circuit 322 for sampling the output signal of the latch circuit 320 at the falling edge of the write control clock signal KW, a latch circuit 323 for sampling the output signal of the latch circuit 322 at the rising edge of the write control clock signal KW, a latch circuit 324 for sampling the output signal of the latch circuit 323 at the falling edge of the write control clock signal KW, and the latch circuit 325 for sampling the output signal of the latch circuit 324 at the rising edge of the write control clock signal KW. The register includes a multiplexer 326 that receives the output signals of the latch circuits 320 and 325, for selecting the output signal of the latch circuit 320 when the R/W signal indicates a read operation and selecting the output signal of the latch circuit 325 when the R/W signal indicates a write operation, an inverter 327 for inverting the output signal of the multiplexer 326 for supply, an inverter 328 for inverting the output signal of the inverter 327 to the inverted signal to the input of the inverter 327, and an inverter (a driver) 333 for inverting the output signal of the inverter 327 to output the address signal ADE. The inverters 327 and 328 constitute a flip-flop.

The output signal ADE of an inverter 333 is supplied to the X decoder 111E. The output of the register 321 is supplied to the X decoder 111F for refreshing as the refresh address signal ADF.

This register further includes match detection circuits 330, 331, and 332. The match detection circuit 332 compares the output signal of the latch circuit 324 with the output signal of the latch circuit 321 to detect whether they match or not. If the match has been detected, the signal HITE is activated (set to the LOW level) and supplied. If a mismatch has been detected, the signal HITE at the HIGH level is output.

The match detection circuit 330 compares the output signal of the latch circuit 329 with the output of the latch circuit 322 to detect whether they match or not. If the match has been detected, the signal HITI is activated and the signal HITI at the LOW level is output. If a mismatch has been detected, the signal HIT1 at the HIGH level is output.

The match detection circuit 331 compares the output signal of the latch circuit 329 with the output of the latch circuit 324 (write address two write cycles earlier) to detect whether they match or not. The signal HIT2 is activated (set to the LOW level) for supply. If a mismatch has been detected, the signal HIT2 at the HIGH level is output.

A pair of the two latch circuits 322 and 323 and a pair of the two latch circuits 324 and 325, of which the latch circuits 322 and 324 sample data at the falling edge of the clock signal (KW) for write control and the latch circuits 323 and 325 sample data at the rising edge of the clock signal (KW) for write control, function as the write address holding circuit which delays a write address by two write cycles according to the specifications for the late write. The latch circuit 325 at the final stage which constitutes the write address holding circuit outputs the write address to the multiplexer 326 at the rise of the clock signal KW for write control, at a timing delayed by two write cycles after the write address has been sampled at the latch circuit 320. The refresh address from the register 321 and the output signal of the latch circuit 324 for outputting the address at the falling edge of the write clock signal in the write cycle subsequent to the cycle where the address AddE has been supplied to the latch circuit 320 (at a time point before two write cycles have elapsed since input of the write address) are supplied to the match detection circuit 332 to make comparison between them to detect whether these addresses match or not.

If the write address two write cycles earlier has matched the refresh address, the signal HITE to the refresh control circuit 131 in FIG. 1 is set to the LOW level, thereby to stop a refresh operation. In other words, the refresh control circuit 131 that receives the signal HITE deactivates the refresh control signal FC, thereby to stop the refresh operation.

Differing from the register 130 shown in FIG. 2, the signal HITE from the register in the present embodiment indicates the result of detection showing that the output signal of the latch circuit 324 placed at a stage in front of the multiplexer 326 matches the refresh address. In this embodiment, comparison for determination of whether a refresh address matches a write address is made before the cycle of a write operation on the cell array is started. If the refresh address matches the write address two write cycles earlier, refresh is stopped. If the match has been detected, the write operation and the refresh operation are simultaneously performed.

Figure 6:
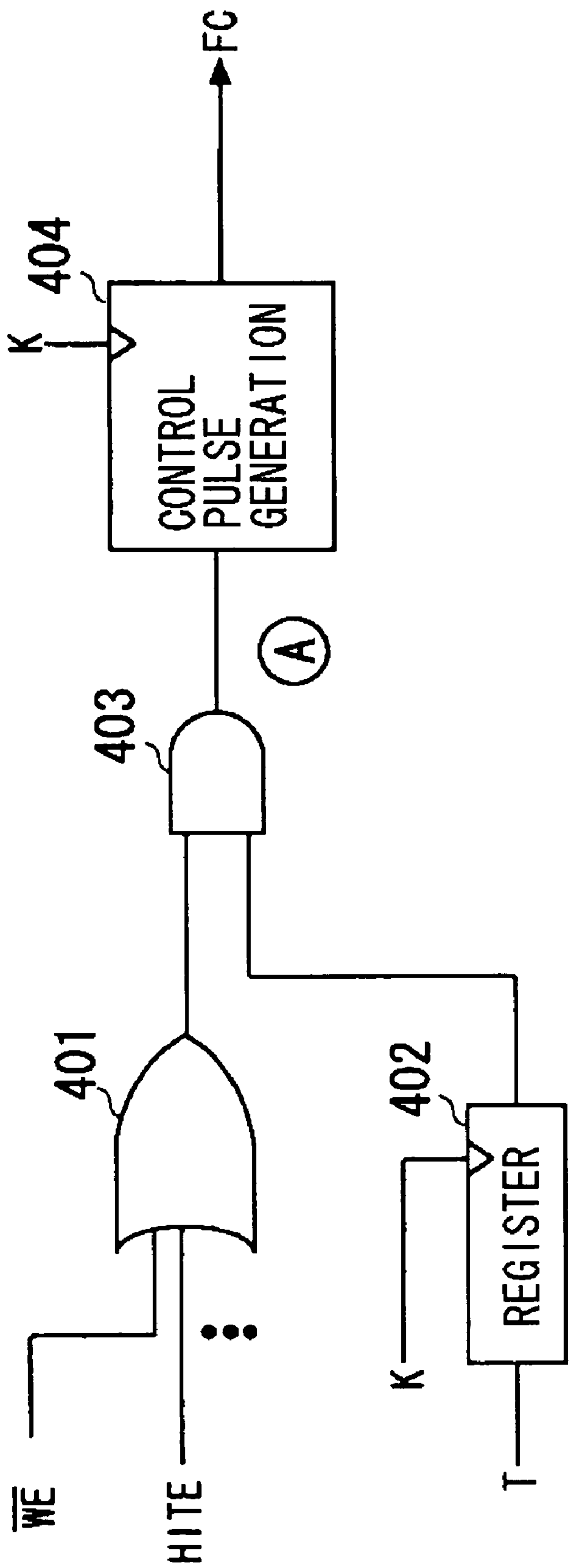
FIG. 6 is a diagram showing a configuration of a refresh control circuit according to the embodiment of the present invention.

FIG. 6 is a block diagram showing an example of the configuration of the refresh control circuit 131 in FIG. 1. Referring to FIG. 6, this refresh control circuit includes a logic gate 401 for receiving a write enable/WE (being active at the LOW level) and the HITE signals, the number of which corresponds to the bit number m of the row address signal (from A0 to Am), from the register shown in FIG. 5 to output the result of an OR operation on these input signals, and a register 402 which samples the refresh trigger signal T output from the timer 128 using the internal clock signal K as sampling clock.

The refresh control circuit 131 includes a logic gate 403 for receiving the output signals of the logic gate 401 and the register 402 and outputting the result of an AND operation of the two input signals, and a control pulse generation circuit 404 for receiving an output signal A of the logic gate 403 and outputting the refresh control signal FC (one-shot pulse) at the rising edge of the internal clock signal K when the output signal A of the logic gate 403 indicates a value commanding a refresh.

The logic gate 401 outputs the LOW level only when the input signals are all LOW, that is, only when the write enable/WE are LOW and the signals HITE the number of which corresponds to the bit number m of the row address signal (from A0 to Am) are all at the LOW level (indicating matches), and outputs the HIGH level for other combinations of logic levels of the input signals. The logic gate 403 instructs the control pulse generation circuit 404 to perform control so that the refresh operation on the refresh address is inhibited in a case where the output signal of the logic gate 401 is LOW when the refresh trigger signal sampled by the register 402 in response to the internal clock signal K is HIGH (even when a refresh request has been made) (or when the write enable/WE are LOW and the row address signal of the write address match the refresh address); that is, (a) In the cycle where the refresh trigger signal T is not generated, the LOW level is output from the register 402, the output signal A of the logic gate 403 is set to the LOW level, so that the control pulse generation circuit 404 deactivates the refresh control signal FC (to be LOW, for example).

(b) When the refresh trigger signal T is generated, when the HIGH level is output from the register 402, and when the LOW level is output from the logic gate 401 (when the signal/WE is LOW and the HITEs are all LOW), the output signal A of the logic gate 403 is set to the LOW level, so that the control pulse generation circuit 404 deactivates the refresh control signal FC (to be LOW, for example).

(c) When the refresh trigger signal T is generated, when the HIGH level is output from the register 402, and when the HIGH level is output from the logic gate 401 (when the signal/WE is HIGH or at least one of the HITEs is HIGH), the output signal A of the logic gate 403 is set to the HIGH level, so that the control pulse generation circuit 404 activates the refresh control signal FC (to be HIGH, for example).

In FIG. 6, for a description purpose, the match detection circuit (indicated by reference numeral 332 in FIG. 5) for detecting that the refresh address matches the write address input at a time corresponding to two write cycles earlier is assumed to be an exclusive OR for inputting two bits, and to include m match detection circuits for the bit number m of the row address signal (A0 to Am) for outputting m HITE signals. On the other hand, if the match detection circuit 332 in FIG. 5 is configured to compare the write address of m bits output from the latch circuit 324 in parallel with the refresh address of m bits output in parallel from the register 321 to detect whether they match, for output of the one-bit signal HITE, the logic gate 401 in FIG. 6 is replaced by a two-input OR circuit that receives the /WE and the signal HITE.

In the configuration shown in FIG. 6, determination as to a write address output from the register for the late write (latch circuit 324) and a refresh address input to the register 321, which was described with reference to FIG. 5, is made one cycle earlier and is indicated by the HITE signal input to the logic gate 401, thereby to hide a delay of the signal HITE on a signal path (a comparison time between the external address and the refresh address). In other words, the signal path from the rise of the internal clock signal K to the rise of the refresh control signal FC is made faster (or a propagation delay time of the signal is shortened).

Figure 7:
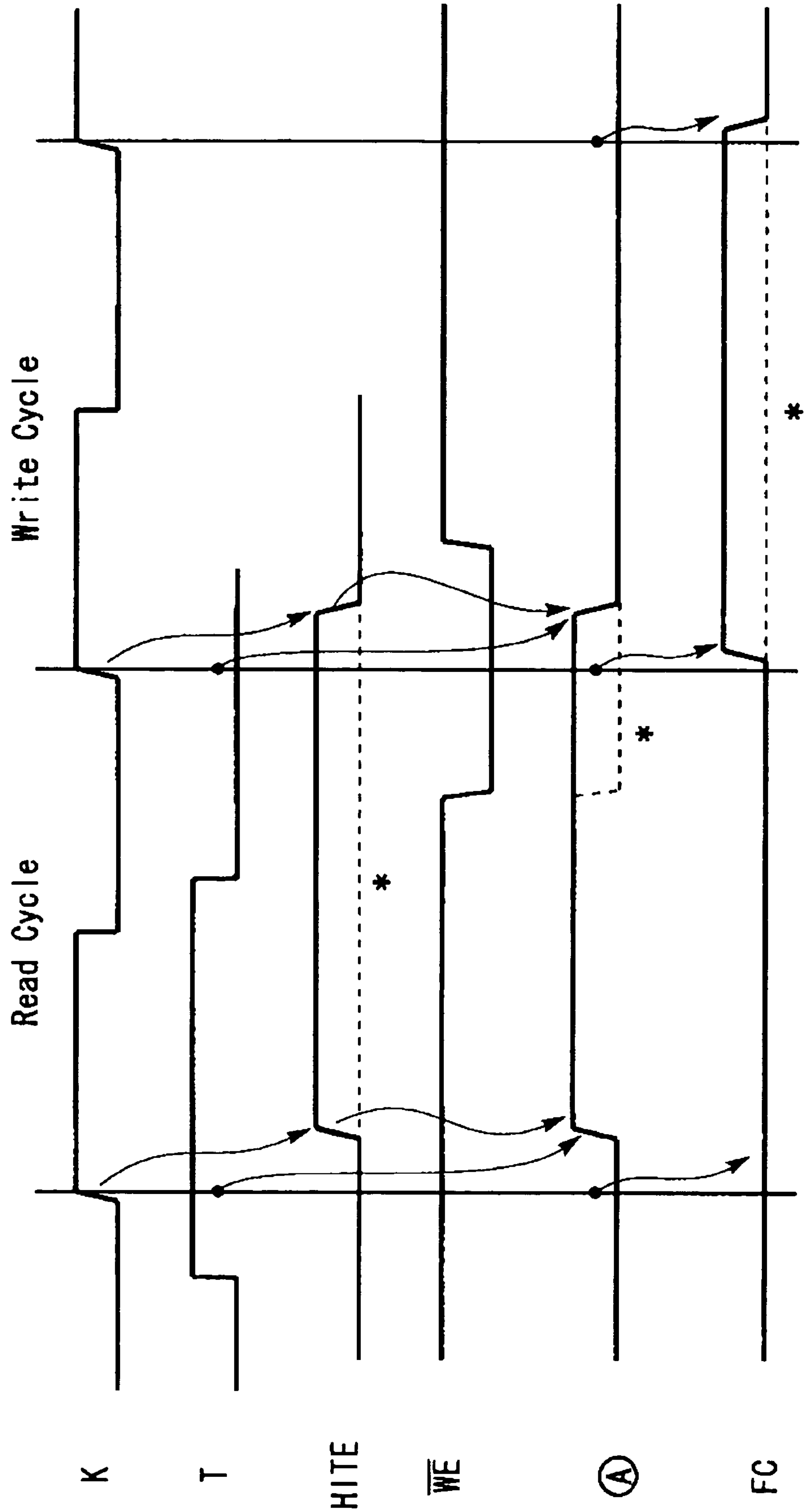
FIG. 7 is a timing diagram for explaining an operation of the refresh control circuit according to the embodiment of the present invention.

FIG. 7 is a timing diagram for explaining an operation of the fresh control circuit shown in FIG. 6. FIG. 7 shows the cases where the signal HITE is set to the HIGH level (indicating that the row address of a write address does not match the refresh address) and the signal HITE is set to the LOW level (indicating that the row address of the write address matches the refresh address) in a cycle immediately before the writing operation on the cell array (in the Write Cycle) is disclosed, using solid lines and broken lines.

In the Read Cycle, the output signal A of the logic gate 403 is kept LOW at the rise of the internal clock signal K, so that the refresh control signal FC output from the control pulse generation circuit 405 remains LOW.

When the /WE signal is LOW and all of m signals HITE for the address from A0 to Am are LOW at the rise of the internal clock signal K in the Write Cycle (the write address two cycles earlier matches the refresh address), the output of the logic gate 401 goes LOW, and a node A for the output of the logic gate 403 goes LOW. At this point, the refresh control signal output from the control pulse generation circuit 404 is set to the LOW level; thus, a refresh is not performed (refer to "*" in the Write Cycle in FIG. 7). Referring to FIG. 7, "*" in the HITE, node A, and FC indicates the case where the write row address has hit the refresh address (HITE=LOW level), and associated broken lines show respective signal waveforms.

When the signal HITE for at least one address of the row address from A0 to Am is HIGH (indicating a mismatch), the node A for the output of the logic gate 403 goes HIGH at the rise of the internal clock signal K in the Write Cycle. The refresh control signal FC output from the control pulse generation circuit 404 is then set to the HIGH level and hence the refresh operation is performed.

Incidentally, a configuration that excludes the register 321 for receiving the refresh address AddF and the match detection circuit 332 in the register shown in FIG. 5 may also be employed as the register 133 in FIG. 1.

Figure 8:
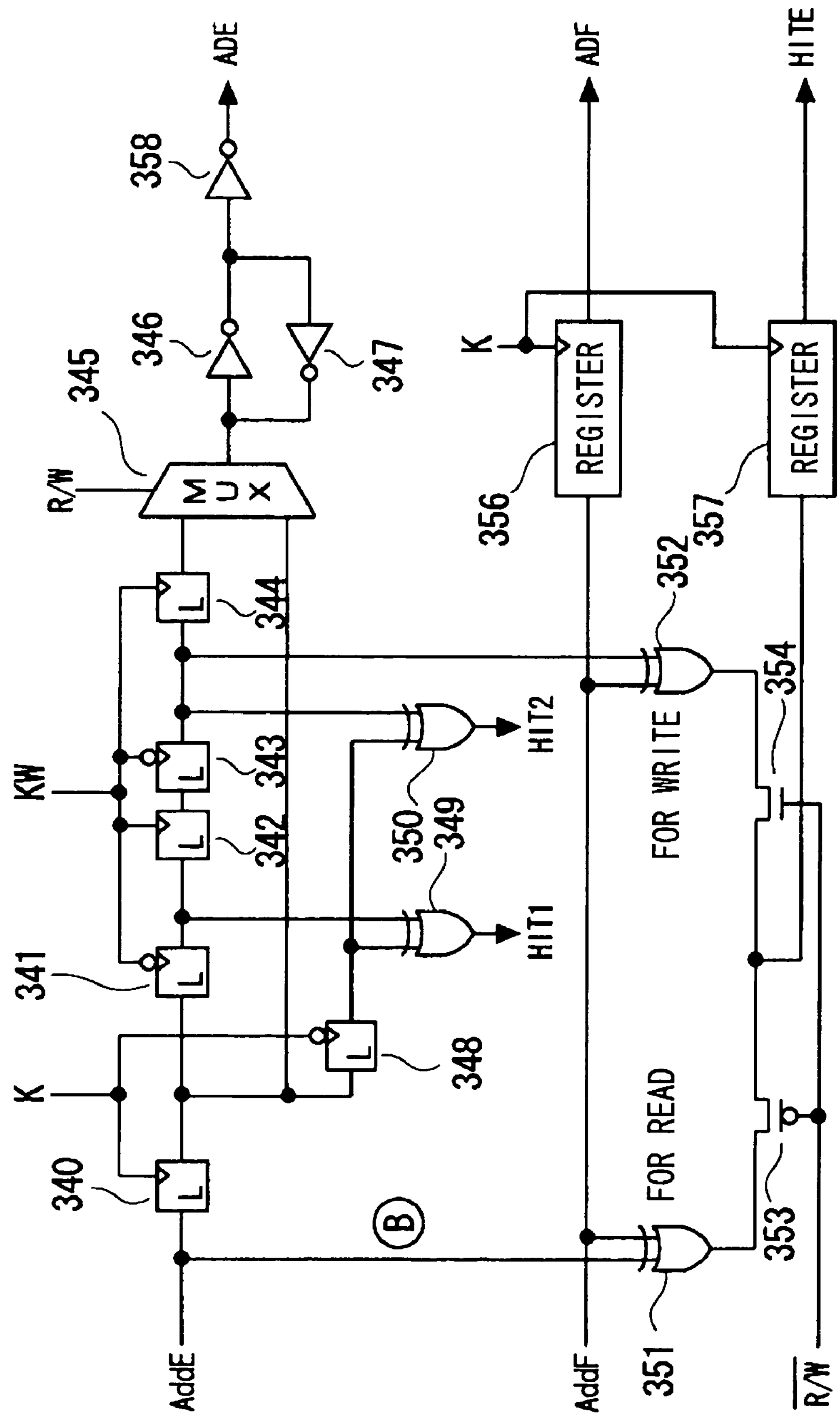
FIG. 8 is a diagram showing still another configuration of the register (REGX) according to the embodiment of the present invention.

FIG. 8 is a block diagram showing still another configuration of the register 130 in FIG. 1. Referring to FIG. 8, this register includes a latch circuit 340 for sampling the external address AddE at the rising edge of the internal clock signal K, a latch circuit 348 for sampling the output signal of the latch circuit 340 at the falling edge of the internal clock signal K, a register circuit (latch circuit) 356 for sampling the refresh address AddF at the rising edge of the internal clock signal K, a latch circuit 341 for latching the output signal of the latch circuit 340 at the falling edge of the write control clock signal KW, a latch circuit 342 for sampling the output signal of the latch circuit 341 at the rising edge of the write control clock signal KW, a latch circuit 343 for latching the output signal of the latch circuit 342 at the falling edge of the write control clock signal KW, and a latch circuit 344 for sampling the output signal of the latch circuit 343 at the rising edge of the write control clock signal KW. The register includes a multiplexer 345 that receives the output signals of the latch circuits 340 and 344, for selecting the output signal of the latch circuit 340 when the R/W signal indicates a read operation and selecting the output signal of the latch circuit 344 when the R/W signal indicates a write operation, an inverter 346 for inverting the output signal of the multiplexer 345 for supply, an inverter 347 for inverting the output signal of the inverter 346 to output the inverted signal to the input terminal of the inverter 346, and an inverter (driver) 358 for inverting the output signal of the inverter 346 for supply as the address signal ADE. The inverters 346 and 347 constitute a flip-flop.

The output signal ADE of the inverter 358 is supplied to the X decoder 111E. The output signal of the register 356 is supplied to the X decoder 111F for refreshing as the refresh address signal ADF.

This register further includes match detection circuits 349 and 350. The match detection circuit 349 compares the output signal of the latch circuit 348 with the output signal of the register 341 to detect whether they match or not. If the match has been detected, the match detection circuit 349 activates the signal HIT1 (to be set to the LOW level), for supply. The match detection circuit 350 compares the output signal of the latch circuit 348 with the output signal of the register 343 to detect whether they match or not. If the match has been detected, the match detection circuit 350 activates the signal HIT2 (to be set to the LOW level), for supply.

This register includes a match detection circuit 351 for a read, which receives the external address AddE and the refresh address AddF. If the external address AddE has matched the refresh address AddF, the match detection circuit 351 outputs the LOW level.

This register includes a match detection circuit 352 which receives the output signal of the latch circuit 343 and the refresh address AddF. If the output signal of the latch circuit 343 has matched the refresh address AddF, the match detection circuit 352 outputs the LOW level.

An output terminal of the match detection circuit 351 is connected to one end of a pass transistor 353 constituted from a PMOS transistor. The output terminal of the match detection circuit 352 is connected to one end of a pass transistor 354 constituted from an NMOS transistor 354. A connection point between the pass transistors 353 and 354 is connected to the register 357. The PMOS transistor 353 receives the R/W signal at its gate terminal, is turned on when the R/W signal is LOW (for a read), and transmits the output signal of the match detection circuit 351 for reading to the register 357.

The NMOS transistor 354 receives the R/W signal at its gate terminal, is turned on when the R/W signal is HIGH (for a write), and transmits the output signal of the match detection circuit 352 to the register 357.

The register 357 samples a signal voltage at the connection node at which the PMOS transistor 353 and the NMOS transistor 354 are tied using the internal clock signal K as a sampling clock to output the sampled signal as the signal HITE.

Determination as to an input (B) of the external address AddE and the refresh address AddF is made at the match detection circuit 351 in a stage in front of the register 357 driven by the internal clock signal K. Then, the result of the determination for reading or writing is selected by the R/W signal and is captured by the register 357 in response to the internal clock signal K. Since a match between the refresh address AddF and the external address AddE can be determined before the rise of the internal clock signal K, a high-speed operation is achieved.

The register which is obtained by excluding from the circuit configuration shown in FIG. 8, the register 356, match detection circuit 351 for reading, match detection circuit 352 for writing, pass transistors 353 and 354, and register 357 may compose the register 133 in FIG. 1.

Figure 9:
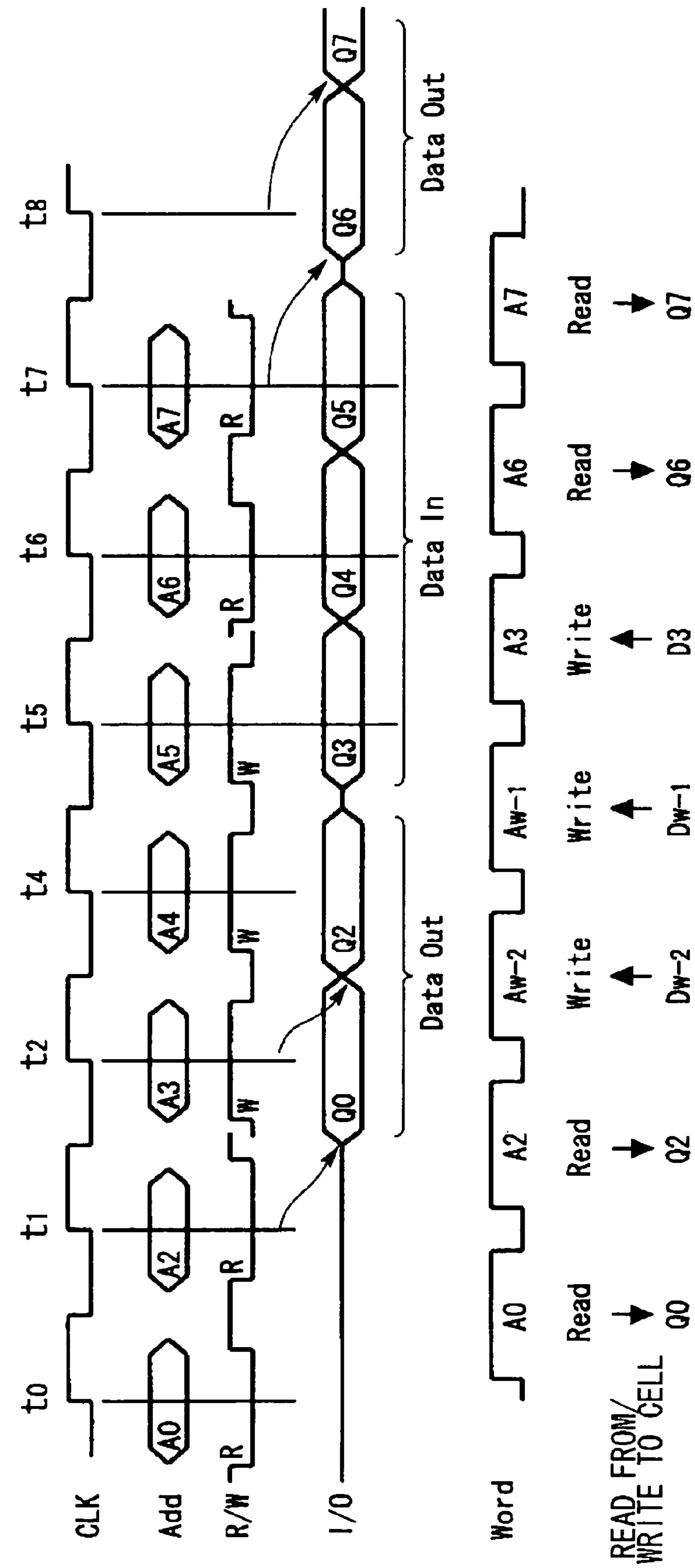
FIG. 9 is a diagram for explaining an operation of ZBT to which the present invention is applied.

FIG. 9 is a timing diagram for explaining the operation of a high-speed SRAM compliant with the ZBT specifications to which the semiconductor memory device having two-port DRAM cells described above has been applied. Referring to FIG. 9, a CLK denotes the clock signal in FIG. 1, an Add denotes the address Add externally supplied to the address terminal in FIG. 1, the R/W denotes the read/write signal R/W in FIG. 1, "R" indicates a read, and "W" indicates a write. I/O indicates data at the I/O terminal in FIG. 1, Word indicates a word line for the cell array, and Read From or Write To Cell indicates reading from or writing to the cell array.

Two cycles from timings t0 and t1, during which the external addresses A0 and A2 are supplied to the address terminal, are read cycles for the cell array, respectively (with the R/W signal being LOW).

Three cycles from timings t2, t4, and t5, during which external addresses A3, A4, and A5 are supplied to the address terminal, are write cycles for the cell array, respectively (with the R/W signal being HIGH).

Two cycles from timings t6 and t7, during which external addresses A6 and A7 are supplied to the address terminal, are read cycles for the cell array (with the R/W signal being LOW).

Read data Q0 and Q2 from the cell array (read data from the memory cells at the addresses A0 and A2) are output at the timings t2 and t4 (refer to "Data Out" in the "I/O" in FIG. 9) from the I/O terminal. Output of the read data from the I/O terminal is delayed by one cycle from input of the read address.

Write data Q3, Q4, and Q5 are input from the I/O terminal at the timings t5, t6, and t7 (refer to "Data In" in the I/O in FIG. 9). At a timing t8, read data Q6 (data read out from the address A6 at the timing t6) is output from the I/O terminal.

The "Word" in FIG. 9 corresponds to the normal word line W(E) in FIG. 1. The A0 and A2 in the "Word" indicate that the word lines associated with the addresses A0 and A2 are selected. The "Read" indicates that a read from a cell is performed. More specifically, as the operation of the cell array, the word lines for the addresses A0 and A2 are selected at the timings t0 and t1, respectively, and the cell data Q0 and Q2 are read out from the cells, respectively.

At the timings t2 and t4, write addresses $A_{w-2}$ and $A_{w-1}$ in cycles preceding a write cycle t2 by two write cycles, which are not shown in FIG. 9, are selected, so that Data $D_{w-2}$ and $D_{w-1}$ are written to the cells, respectively (for late writes).

At the timing t5, the address A3 two write cycles earlier is selected (for a late write), so that D3 is written to the cell.

At the timings t6 and t7, the addresses A6 and A7 are selected, so that the cell data Q6 and cell data Q7 are read out from the cells. As shown in FIG. 9, a pipeline burst operation is performed: a read/write operation from address input to data input/output is delayed by ½ clock cycle. No dead cycle exists for a data bus at a time of switching the read/write operation. Use in the maximum memory bandwidth is thereby enabled, thus achieving the high-speed operation.

Figure 10:
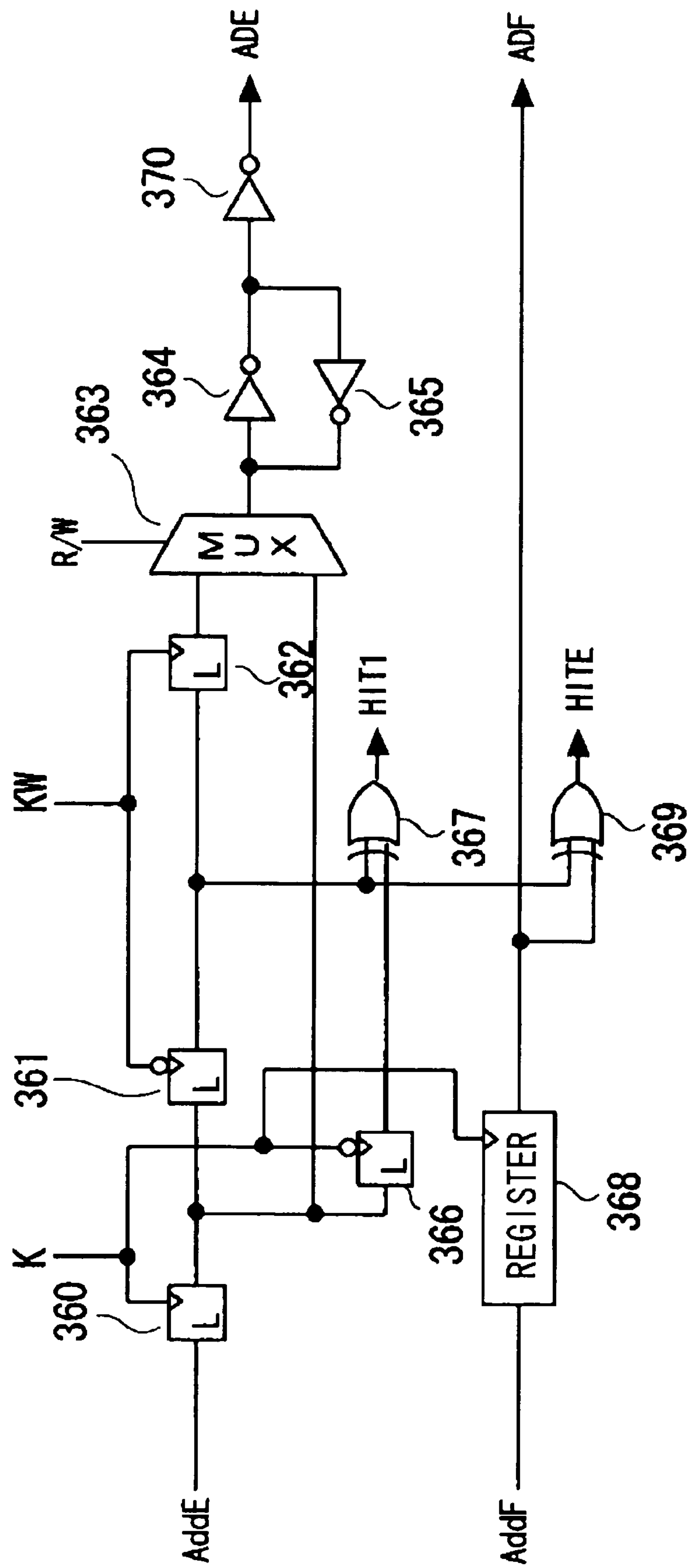
FIG. 10 is a diagram showing still another configuration of the register (REGX) according to an embodiment of the present invention.
Figure 11:
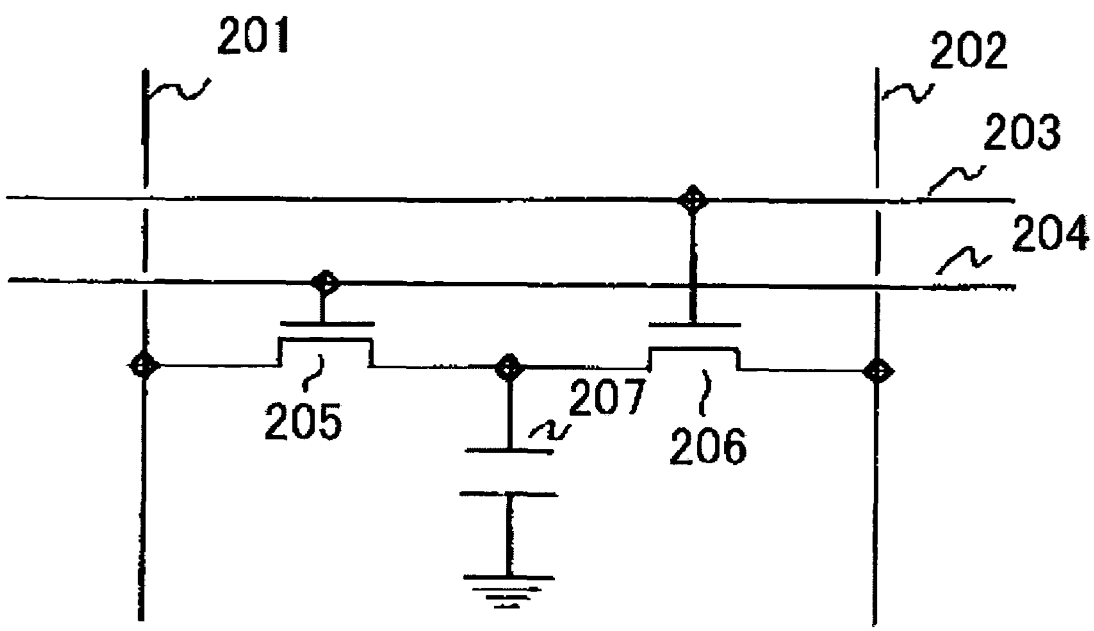
FIG. 11 is a diagram showing a configuration of a conventional DRAM cell.

Another embodiment of the present invention will be also described below. FIG. 10 is a block diagram showing other configuration of the register 130 in FIG. 1, for a one-stage late write. Referring to FIG. 10, this register includes a latch circuit 360 for sampling the external address AddE at the rising edge of the internal clock signal K from the LOW level to the HIGH level, a latch circuit 366 for sampling the output signal of the latch circuit 360 at the falling edge of the internal clock signal K from the HIGH level to the LOW level, a register (latch circuit) 368 for sampling the refresh address AddF at the rising edge of the internal clock signal K, a latch circuit 361 for latching the output signal of the latch circuit 360 at the falling edge of the write control clock signal KW (at the rise of the internal clock signal K constituting a sampling signal for the latch circuit 360 and at the fall of the clock signal KW in the same cycle), a latch circuit 362 for latching the output signal of the latch circuit 361 at the rising edge of the write control clock signal KW (at the rise of the clock signal KW in the write cycle subsequent to the cycle in which latching has been performed by the latch circuit 360), a multiplexer 363 that receives the output signals of the latch circuits 360 and 362, for selecting the output signal of the latch circuit 360 when the R/W signal indicates a read and selecting the output signal of the latch circuit 362 when the R/W signal indicates a write, an inverter 364 for inverting the output signal of the multiplexer 363 for supply, an inverter 365 for inverting the output signal of the inverter 364 to provide the inverted signal to the inverter 364, and an inverter 370 for inverting the output signal of the inverter 364 to output the inverted signal as the output signal ADE. The inverters 364 and 365 constitute a flip-flop.

The output signal ADE of the inverter 370 is supplied to X decoder 111E. The output signal of the register 368 is supplied to the X decoder 111F for refreshing as the refresh address signal ADF.

Referring to FIG. 10, this register further includes match detection circuits 367 and 369. The match detection circuit 369 compares the output signal of the latch circuit 361 with the output signal of the register 368 to detect whether they match or not. If the match has been detected, the match detection circuit 369 activates the signal HITE (to be set to the LOW level), for supply. In this configuration as well, the match detection circuit 369 is configured to detect whether the refresh address matches the write address or not before the write address is delayed by one write cycle.

The match detection circuit 367 compares the output signal of the latch circuit 366 with the output signal of the latch circuit 361. If they match, the match detection circuit 367 activates the signal HIT1 (to be set to the LOW level), for supply. If a mismatch has been detected, the match detection circuit 367 outputs the signal HIT1 at the HIGH level.

The latch circuit 361 for performing latching at the falling edge of the write control clock signal KW and the latch circuit 362 for performing latching at the rising edge of the write control clock signal KW function as the write address holding circuit for delaying the write address by one write cycle.

The register 133 in FIG. 1 may also have a one-late-write configuration according to the configuration in FIG. 10. More specifically, the register 133 in FIG. 1 is configured by omitting the register 368 for latching the refresh address and the match detection circuit 369 in FIG. 10. The chip enable signal /CE may also be employed as a latch timing signal in place of the clock signal CLK and the internal clock signal K. Alternatively, in the read operation, the chip enable signal may be employed in place of the internal clock signal K, and in the write operation, the write enable signal/WE may be employed in place of the write control clock signal KW. With this arrangement, the present invention can be applied to a pseudo SRAM as well, other than the clock-synchronous-type SRAM. As a variation of the embodiments described above, the R/W control circuit 132 may be controlled by the output of the HIT determination circuit 134 in FIG. 1. If a match has been detected at the HIT determination circuit 134, reading from the cell array 100 may be disabled.

In the embodiments described above, the row address signal of the write address delayed by a predetermined cycle are compared with the refresh address at the register 130. The match detection signal HITE is thereby generated to perform control over the refresh operation. The row address signal of an externally supplied read address may be compared with the refresh address, for example. Then, if a mismatch between them has been detected, the refresh operation on the cell array selected by the refresh address may be performed at the same time as data reading from the cell array selected by the read address. If the match has been detected, the refresh operation may be inhibited, and data reading from the cell array selected by the read address may be performed.

A foregoing description of the present invention was directed in conjunction with the above-mentioned embodiments. The present invention, however, is not limited to the above-mentioned embodiments, and naturally includes various variations and modifications which could be made by those skilled in the art within the scope of the invention defined in the claims.

The meritorious effects of the present invention are summarized as follows.

As described above, according to the present invention, dual-port DRAM cells with word lines, bit lines, and a sense amplifier for refreshing are included, and a read/write operation and a refresh operation are made to be performed concurrently if a refresh address does not match an external address. A need for provision of a deselect time for the refresh operation is thereby eliminated, so that a clock-synchronous-type high-speed SRAM can be implemented at a low cost, with a smaller chip area and lower power dissipation.

Further, according to the present invention, before a write operation is started on the cell array, a refresh address is compared with a write address to detect whether the refresh address matches the write address or not. A delay on a signal path from a timing of latching of the refresh address to output of the refresh control signal is apparently reduced, thereby enabling a high-speed operation.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising a cell array including a plurality of memory cells, each of said memory cells including:

first and second switch transistors connected in series between a bit line for normal access and a bit line for refresh; and a capacitor for data storage connected to a connection node at which the first and second switch transistors are tied;

the first and second switch transistors having control terminals connected to a word line for normal access and a word line for refreshing respectively;

said semiconductor memory device, being configured as a late-write configuration, in which a write to a memory cell selected by a write address supplied to an address terminal of said semiconductor memory device from an outside of said semiconductor memory device is performed with a delay of at least one write cycle from input of the write address, further comprising:

a sense amplifier for refreshing, connected to the bit line for refreshing:

a determination unit for comparing a refresh address with a row address of a write address externally supplied to the address terminal at least one write cycle before to determine whether the refresh address matches the row address or not to output a determination result; and a control unit for performing control so that when a mismatch between the refresh address and the row address of the write address is detected by the determination circuit, a write operation and a refresh operation are performed concurrently in an identical cycle, in which the write operation is performed by activating the word line for normal access selected by the write address, turning on the first switch transistor in the memory cell connected to said word line for normal access, and writing data to the capacitor through the bit line for normal access, while the refresh operation is performed by activating the word line for refreshing selected by the refresh address, turning on the second switch transistor in the memory cell connected to said word line for refreshing, and reading a cell data and restoring said cell data through the bit line for refreshing by the sense amplifier for refreshing connected to the bit line for refreshing, and when a match between the refresh address and the row address of the write address is detected by the determination circuit, the refresh operation is inhibited while the write operation is performed.

2. The semiconductor memory device according to claim 1, wherein said determination circuit compares the refresh address with the row address of the write address to detect whether the refresh address matches the row address of the write address or not before a cycle for performing the write operation on said cell array is started.

3. The semiconductor memory device according to claim 1, comprising:

a write address holding circuit for holding the write address externally supplied and for delaying the write address by a predetermined number of write cycles corresponding to the late-write configuration to output the delayed write address;

a selection circuit, receiving a control signal for commanding a read/write operation as a selection control signal and receiving the externally input address and the address output from said write address holding circuit, for selecting the externally input address when the control signal indicates a read operation and for selecting the address output from said write address holding circuit when the control signal indicates a write to output the selected address, the address output from said selection circuit being supplied to an X decoder for selecting the word line for normal access; and a match detection circuit for comparing the refresh address with the row address of the write address held in said write address holding circuit at a time point before output of the write address delayed by the predetermined number of write cycles is performed by the write address holding circuit to detect whether the refresh address matches the row address of the write address or not; wherein a judgement whether the row address of the write address matches the refresh address or not being performed before a cycle of performing the write operation on said memory cell on said cell array selected by the write address is started.

4. The semiconductor memory device according to claim 3, further comprising:

at least one third match detection circuit for comparing the externally input address with the write address, which is held in said write address circuit and which is at a stage before output from said write address holding circuit is performed, to detect whether the externally input address matches the write address or not; and a control circuit for performing control so that write data associated with the write address, held in a data holding circuit during a period corresponding to the late-write configuration is output to a data output terminal as read data, when the write address matches an externally input read address.

5. The semiconductor memory device according to claim 1, further comprising:

a write address holding circuit for holding the externally input write address and delaying the externally input write address by a predetermined number of write cycles corresponding to the late-write configuration to output the delayed write address;

a selection circuit, receiving a control signal for commanding a read/write operation as a selection control signal and receiving the externally input address and the address output from said write address holding circuit, for selecting the externally input address when the control signal indicates a read operation and for selecting the address output from said write address holding circuit when the control signal indicates a write operation to output the selected address, the address output from said selection circuit being supplied to an X decoder for selecting the word line for normal access; and a match detection circuit for comparing the row address output from said selection circuit with the refresh address to detect whether the row address matches the refresh address or not.

6. The semiconductor memory device according to claim 1, further comprising:

a write address holding circuit for holding the externally input write address and delaying the externally input write address by a predetermined number of write cycles corresponding to the late-write configuration to output the delayed write address;

a first selection circuit, receiving a control signal for commanding a read/write operation as a selection control signal and receiving the externally input address and the address output from said write address holding circuit, for selecting the externally input address when the control signal indicates a read operation and for selecting the address output from said write address holding circuit when the control signal indicates a write operation to output the selected address, the address output from said first selection circuit being supplied to an X decoder for selecting the word line for normal access;

a first match detection circuit for comparing the externally input row address with the refresh address to detect whether the row address matches the refresh address or not;

a second match detection circuit for comparing the refresh address with the row address of the write address held in said write address holding circuit at a time point before output of the write address delayed by the predetermined number of write cycles is performed to detect whether the refresh address matches the row address or not; and a second selection circuit, receiving the control signal for commanding a read/write operation as a selection control signal and receiving output signals of said first and second match detection circuits, for selecting an output signal of said first match detection circuit when the control signal indicates the read operation and for selecting an output signal of said second match detection circuit when the control signal indicates write operation, to output the selected signal, the signal output from said second selection circuit being used as the determination result of said determination unit.

7. The semiconductor memory device according to claim 6, further comprising:

at least one third match detection circuit for comparing the externally input address with the write address, which is held in said write address circuit and which is at a stage before output from said write address holding circuit is performed, to detect whether the externally input address matches the write address or not; and a control unit for performing control so that write data associated with the write address, held in a data holding circuit during a period corresponding to the late-write configuration is output to a data output terminal as read data, when the write address matches an externally input read address.

8. The semiconductor memory device according to claim 1, further comprising:

a control circuit, receiving the determination result output from said determination unit, for performing control so that when there is at least one mismatching bit between the row address of the write address and the refresh address, a refresh control signal for controlling the refresh operation is activated, and the refresh operation using the word line for refreshing, selected by the refresh address is performed concurrently with the write operation on said memory cell selected by the write address during the same cycle, and when the row address of the write address and the refresh address match in all bit positions, the refresh control signal is deactivated to disable the refresh operation, and only the write operation on said memory cell selected by the write address is performed.

9. The semiconductor memory device according to claim 1, wherein said semiconductor memory device includes:

a timer for generating a trigger signal for specifying a refresh cycle; and a refresh address generation circuit for generating the refresh address based on the trigger signal from said timer, on a same chip; and wherein said semiconductor memory device is interface compatible with a static random access memory of a clock synchronous type.

10. The semiconductor memory device according to claim 1, comprising:

a first X decoder for decoding the row address of an input address externally supplied to the semiconductor memory device;

a second X decoder for decoding the refresh address, wherein the word line for normal access is connected to the first X decoder;

a first sense amplifier for normal access; and a second sense amplifier constituting said sense amplifier for refreshing;

wherein the word line for normal access is connected to the first X decoder;

the word line for refreshing is connected to the second X decoder;

said first and second X decoders are disposed to be opposite to each other with said cell array interposed therebetween;

the bit line for normal access is connected to the first sense amplifier;

the bit line for refreshing is connected to the second sense amplifier; and said first and second sense amplifiers are disposed to be opposite to each other with respect to said cell array interposed therebetween.

11. The semiconductor memory device according to claim 1, further comprising:

a sense amplifier for normal access, connected to the bit line for normal access; and a control circuit for performing control so that when the normal access and the refresh are performed in an identical cycle, activation of said sense amplifier for refreshing and activation of said sense amplifier for normal access are simultaneously started.

12. A semiconductor memory device comprising:

a cell array having a plurality of memory cells;

a first X decoder for decoding a row address of an input address externally supplied to said semiconductor memory device;

a second X decoder for decoding a refresh address;

a first sense amplifier for normal access;

a second sense amplifier for refreshing;

a timer for generating a trigger signal for specifying a refresh cycle; and a refresh address generation circuit, receiving the trigger signal output from said timer, for generating the refresh address based on the trigger signal;

wherein each of said memory cells includes:

first and second switch transistors connected in series between a first bit line and a second bit line adjacent to each other; and a capacitor for data storage connected to a connection node at which the first and second switch transistors are tied;

the first switch transistor having a control terminal connected to a first word line to be controlled on/off;

the second switch transistor having a control terminal connected to a second word line adjacent to the first word line to be controlled on/off;

and wherein the first word line is connected to the first X decoder;

the second word line is connected to the second X decoder; said first and second X decoders being disposed to be opposite to each other with said cell array interposed therebetween;

the first bit line is connected to the first sense amplifier; and the second bit line is connected to the second sense amplifier;

said first and second amplifiers being disposed to be opposite to each other with said cell array interposed therebetween;

said semiconductor memory device further comprising:

a match detection circuit for comparing the refresh address from said refresh address generation circuit with the row address of the externally supplied write address delayed by a period corresponding to a predetermined number of write cycles to detect whether the refresh address matches the row address or not; and a control unit for performing control so that when a mismatch between the refresh address and the row address of the write address is detected by the match detection circuit, a write operation and a refresh operation are concurrently performed in an identical cycle, in which the write operation is performed by activating the first word line selected as a result of decoding the row address of the write address by said first X decoder, turning on the first switch transistor for the memory cell connected to the first word line, and writing data to said memory cell selected by the write address, while the refresh operation is performed by activating the second word line selected as a result of decoding the refresh address by said second X decoder and using said second sense amplifier on the memory cell connected to the second word line, and when the match between the refresh address and the row address of the write address is detected by the match detection circuit, the refresh operation is inhibited, the first word line selected by decoding by said first X decoder is activated, and then the write operation on said memory cell selected by the write address is performed.

13. The semiconductor memory device according to claim 12, further comprising:

an input buffer for receiving a row address of an input address externally supplied to said semiconductor memory device;

a first latch circuit for sampling an output signal of the input buffer using an internal clock signal as a sampling clock;

a second latch circuit for sampling the refresh address output from said refresh address generation circuit using the internal clock signal as a sampling clock;

a write address holding circuit including a plurality of latch circuits connected in cascade connection, each latching a signal at an input terminal thereof to output a sampled signal from an output terminal thereof using a clock signal for write control activated during a write cycle as a sampling clock, a first stage of said latch circuits receiving an output signal of said first latch circuit at the input terminal thereof and a last stage of said latch circuits delaying the output signal of said first latch circuit by the predetermined number of write cycles to output the delayed signal from an output terminal thereof;

a selection circuit, receiving a control signal for commanding a read/write operation as a selection control signal and receiving the output signal of said first latch circuit and an output signal of said write address holding circuit, for selecting the output signal of said first latch circuit when the control signal indicates a read operation and selecting the output signal of said write address holding circuit when the control signal indicates a write operation to output the selected signal; and a match detection circuit for comparing the output signal of said selection circuit with an output signal of said second latch circuit to detect whether the output signal of said selection circuit matches the output signal of said second latch circuit or not.

14. The semiconductor memory device according to claim 13, wherein said write address holding circuit comprises pairs of latch circuits connected in cascade connection, each of said pairs of said latch circuits sampling data at falling or rising edge of the clock signal for write control, respectively, a number of said pairs being equivalent to the predetermined number of write cycles.

15. The semiconductor memory device according to claim 13, further comprising:

a data holding circuit for holding write data;

at least one match detection circuit for comparing the write address output from a stage of latch circuits preceding a last stage in said write address holding circuit with the externally input address to detect whether the write address matches the externally input address or not; and a control circuit for performing control so that when the write address matches an externally input read address, write data associated with the write address and held at the data holding circuit during a period specified for a late write is output to a data output terminal as read data.

16. The semiconductor memory device according to claim 13, wherein a chip enable signal is employed for the internal clock signal and a write enable signal is employed for the clock signal for write control.

17. The semiconductor memory device according to claim 16, wherein said write address holding circuit delays the externally input address by one write cycle.

18. The semiconductor memory device according to claim 12, further comprising:

an input buffer for receiving a row address of an input address externally supplied to said semiconductor memory device;

a first latch circuit for sampling an output signal of the input buffer with an internal clock signal;

a second latch circuit for sampling the refresh address output from said refresh address generation circuit with the internal clock signal;

a write address holding circuit including a plurality of latch circuits connected in cascade connection, each sampling a signal at an input terminal thereof to output a sampled signal from an output terminal thereof with a clock signal for write control activated during a write cycle, a first stage of said latch circuits receiving an output signal of said first latch circuit at the input terminal thereof and a last stage of said latch circuits delaying the output signal of said first latch circuit by the predetermined number of write cycles to output the delayed signal from the output terminal thereof;

a selection circuit, receiving the output signal of said first latch circuit and an output signal of said write address holding circuit, for selecting the output signal of said first latch circuit in case of a read operation and for selecting the output signal of said write address holding circuit in case of a write operation, according to a control signal for commanding a read/write operation to output the selected signal; and a match detection circuit for comparing an output signal of said latch circuit at a stage preceding said last stage of said latch circuits in said write address holding circuit with an output signal of said second latch circuit to detect whether the output signal of said latch circuit matches the output signal of said second latch circuit or not.

19. The semiconductor memory device according to claim 18, wherein said write address holding circuit comprises pairs of latch circuits connected in cascade connection, each of said pairs of said latch circuits sampling data at falling or rising edge of the clock signal for write control, respectively, a number of said pairs being equivalent to the predetermined number of write cycles.

20. The semiconductor memory device according to claim 12, further comprising:

an input buffer for receiving a row address of an input address externally supplied to said semiconductor memory device;

a first latch circuit for sampling an output signal of the input buffer with an internal clock signal;

a write address holding circuit including a plurality of latch circuits connected in cascade connection, each sampling a signal at an input terminal thereof to output a sampled signal from an output terminal thereof with a clock signal for write control activated during a write cycle, a first stage of said latch circuits receiving an output signal of said first latch circuit at the input terminal thereof and a last stage of said latch circuits delaying the output signal of said first latch circuit by the predetermined number of write cycles to output the delayed signal from the output terminal thereof;

a first selection circuit, receiving a control signal for commanding a read/write operation as a selection control signal and receiving the output signal of said first latch circuit and an output signal of said write address holding circuit, for selecting the output signal of said first latch circuit when the control signal indicates a read operation and for selecting the output signal of said write address holding circuit when the control signal indicates a write operation to output the selected signal;

a first match detection circuit for comparing the externally input row address with the refresh address output from said refresh address generation circuit to detect whether the externally input row address matches the refresh address or not;

a second match detection circuit for comparing an output signal of a stage of said latch circuits preceding said last stage of said latch circuits in said write address holding circuit with the refresh address to detect whether the output signal of said stage matches the refresh address or not; and a second selection circuit, receiving the control signal for commanding a read/write operation as a selection control signal and receiving output signals of said first and second match detection circuits, for selecting an output signal of said first match detection circuit when the control signal indicates the read operation and for selecting an output signal of said second match detection circuit when the control signal indicates the write operation to output the selected signal.

21. The semiconductor memory device according to claim 20, wherein said write address holding circuit comprises pairs of latch circuits connected in cascade connection, each of said pairs of said latch circuits sampling data at falling or rising edge of the clock signal for write control, respectively, a number of said pairs being equivalent to the predetermined number of write cycles.

22. The semiconductor memory device according to claim 12, wherein the semiconductor memory device is interface compatible with a clock synchronous type static random access memory.

23. The semiconductor memory device according to claim 12, further comprising:

a control circuit for performing control so that when activation of said first sense amplifier and activation of said second sense amplifier are performed during the same cycle, the activation of said first sense amplifier and the activation of said second sense amplifier are simultaneously started.

24. A semiconductor memory device which has an interface compatible with that of a static random access memory compliant with a late-write specification, said semiconductor memory device comprising:

a cell array including a plurality of two-port DRAM cells;

a refresh address generation circuit;

a comparator for comparing a refresh address output from the refresh address generation circuit with a write address delayed by a period corresponding to a write access cycle defined in the late-write specification; and a control unit for performing control so that a refresh operation is stopped when a comparison result by the comparator indicates that the refresh address matches the write address.

25. The semiconductor memory device according to claim 24, wherein the semiconductor memory device has an interface compatible with that of a static random access memory compliant with zero bus turnaround specifications.

26. A semiconductor memory device comprising:

a memory cell array including a read/write address input port and a refresh address input port, a read/write access to a memory cell therein specified by an address input from said read/write address input port and a refresh on a memory cell therein specified by an address input from said refresh address input port in synchronization with the read/write access being simultaneously performed;

an address holding circuit and a data holding circuit for holding the address supplied to an address terminal thereof from an outside of said semiconductor memory device and data supplied to a data terminal thereof from the outside of said semiconductor memory device, respectively;

a first determination circuit for comparing a row address held in said address holding circuit and the refresh address supplied from said refresh address input port to detect whether the row address matches the refresh address or not;

a second determination circuit for comparing the address held in said address holding circuit with an externally input read address to detect whether the address held in said address holding circuit matches the externally input read address or not;

a first control circuit for performing control so that when said first determination circuit detects a mismatch, a write operation for writing the data held in said data holding circuit to the memory cell specified by the address, held in said address holding circuit and supplied to said memory cell array from said read/write address input port and a refresh operation on the refresh address are simultaneously performed, in synchronization with the write operation, and when said first determination circuit detects the match, the refresh operation is inhibited and the write operation is performed; and a second control circuit for performing control so that when said second determination circuit detects a mismatch, the address held in said address holding circuit is supplied to the memory cell array from said read/write address input port and data is read from the memory cell specified by the address to output from said data terminal; and when said second determination circuit detects the match, the data is read from said data holding circuit instead of said memory cell array to output from said data terminal.

27. A method of controlling a semiconductor memory device, said semiconductor memory device comprising: a cell array including a plurality of memory cells, each of said memory cells comprising:

first and second switch transistors connected in series between a bit line for normal access and a bit line for refreshing; and a capacitor for data storage, connected to a connection node at which the first and second switch transistors are tied; a word line for normal access and a word line for refreshing being connected to respective control terminals of the first and second switch transistors;

said semiconductor memory device having a late-write configuration in which a write to a memory cell selected by a write address supplied to an address terminal of said semiconductor memory device from an outside of said semiconductor memory device is performed, being delayed by at least one write cycle; said method comprising the steps of:

comparing a generated refresh address with the write address externally supplied to the address terminal at least one write cycle earlier to detect whether the refresh address matches the write address or not;

performing control so that when a mismatch between the refresh address and the row address of the write address is detected, a write operation and a refresh operation are concurrently performed in an identical cycle, in which the write operation is performed by activating the word line for normal access selected by the write address, turning on the first switch transistor for the memory cell connected to said word line for normal access, and writing data to the capacitor through the bit line for normal access, while the refresh operation is performed by activating the word line for refreshing selected by the refresh address, turning on the second switch transistor for the memory cell connected to said word line for refreshing, and reading cell data and restoring said cell data through the bit line for refreshing using a sense amplifier for refreshing connected to said bit line for refreshing; and when a match between the refresh address and the row address of the write address is detected, the refresh operation is inhibited and the write operation is performed.

28. The method according to claim 27, further comprising the step of:

comparing the refresh address with the write address to detect whether the refresh address matches the write address or not before a cycle of performing the write operation on said cell array is started.

29. A method of controlling a semiconductor memory device comprising a cell array including a plurality of memory cells each requiring a refreshing to hold stored data, an address holding circuit for holding an address input to an address terminal thereof, and a data holding circuit for holding data input to a data terminal thereof, the address and the data supplied from an outside of said semiconductor memory device, said method comprising the steps of:

storing the externally input address and the data in said address holding circuit and said data holding circuit, respectively;

comparing a row address of the write address held in said address holding circuit with a refresh address to detect whether the row address matches the refresh address or not, and simultaneously performing a write operation for writing the data held in said data holding circuit to said cell array and a refresh operation on said cell array when a mismatch between the row address of the write address and the refresh address is detected, and inhibiting the refresh operation and performing the write operation when the match between the row address of the write address and the refresh address is detected; and comparing the write address held in said address holding circuit with an externally input read address to detect whether the write address matches the externally input read address or not, reading data from said cell array for supply from said data terminal when a mismatch is detected, and reading the data held in said data holding circuit for supply from said data terminal when the match is detected.

30. The method of controlling a semiconductor memory device according to claim 29, further comprising the step of:

comparing the externally input read address with the refresh address to detect whether the externally input read address matches the refresh address or not, performing control to execute simultaneously the refresh operation on said cell array selected by the refresh address and reading data from said cell array selected by the read address when a mismatch is detected; and performing control to inhibit the refresh operation and to execute reading data from said cell array selected by the read address when a match is detected.

* * * * *